(12) United States Patent
Yamazaki et al.

(10) Patent No.: US 11,796,871 B2
(45) Date of Patent: Oct. 24, 2023

(54) DISPLAY DEVICE AND ELECTRONIC DEVICE

(71) Applicant: Semiconductor Energy Laboratory Co., Ltd., Atsugi (JP)

(72) Inventors: Shunpei Yamazaki, Setagaya (JP); Daisuke Kubota, Atsugi (JP); Hideki Uochi, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 17/386,849

(22) Filed: Jul. 28, 2021

(65) Prior Publication Data

US 2021/0356784 A1 Nov. 18, 2021

Related U.S. Application Data

(63) Continuation of application No. 15/623,876, filed on Jun. 15, 2017, now Pat. No. 11,106,099.

(30) Foreign Application Priority Data

Jun. 24, 2016 (JP) ................... 2016-125667
Jul. 1, 2016 (JP) ................... 2016-131297
Aug. 5, 2016 (JP) ................... 2016-154452

(51) Int. Cl.
*G02F 1/1347* (2006.01)
*G02F 1/1362* (2006.01)
(Continued)

(52) U.S. Cl.
CPC ...... *G02F 1/1347* (2013.01); *G02F 1/133305* (2013.01); *G02F 1/133308* (2013.01);
(Continued)

(58) Field of Classification Search
CPC ............. G02F 1/1347; G02F 1/133305; G02F 1/133308; H01L 27/3232
See application file for complete search history.

(56) References Cited

U.S. PATENT DOCUMENTS 6,072,566 A 6/2000 Fujii et al.
6,421,054 B1 7/2002 Hill et al.
(Continued)

FOREIGN PATENT DOCUMENTS

EP 1037193 A 9/2000
JP 2001-066593 A 3/2001
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Lucy P Chien
(74) *Attorney, Agent, or Firm* — ROBINSON INTELLECTUAL PROPERTY LAW OFFICE; Eric J. Robinson

(57) ABSTRACT

A highly reliable display device is provided. In a flexible display device including at least a first display region and a second display region, at least a portion of a wiring provided in the first display region or the second display region has a meandering shape or a chain-like shape. Since the wiring has a meandering shape or a chain-like shape, a short-circuit, a disconnection, or the like of the wiring due to curving or bending of the display device does not occur easily. The wiring having a meandering shape or a chain-like shape can prevent defective operation, lowered reliability, or the like of the display device.

17 Claims, 30 Drawing Sheets

(51) Int. Cl.
*H01L 27/32* (2006.01)
*G02F 1/1333* (2006.01)
*G02F 1/1335* (2006.01)
*H10K 59/50* (2023.01)
*H10K 59/131* (2023.01)
*H10K 102/00* (2023.01)

(52) U.S. Cl.
CPC ..... *G02F 1/136286* (2013.01); *H10K 59/131* (2023.02); *H10K 59/50* (2023.02); *G02F 1/13478* (2021.01); *G02F 1/133553* (2013.01); *G02F 2201/44* (2013.01); *G02F 2203/02* (2013.01); *H10K 2102/311* (2023.02)

(56) References Cited

U.S. PATENT DOCUMENTS

| | | |
|---|---|---|
| 6,512,505 B1 | 1/2003 | Uchino et al. |
| 6,697,039 B1 | 2/2004 | Yamakawa et al. |
| 6,714,268 B2 | 3/2004 | Wang et al. |
| 7,006,189 B2 | 2/2006 | Kim et al. |
| 7,038,641 B2 | 5/2006 | Hirota et al. |
| 7,084,936 B2 | 8/2006 | Kato |
| 7,102,704 B2 | 9/2006 | Mitsui et al. |
| 7,126,574 B2 | 10/2006 | Uchino et al. |
| 7,176,991 B2 | 2/2007 | Mitsui et al. |
| 7,239,361 B2 | 7/2007 | Kato |
| 7,248,235 B2 | 7/2007 | Fujii et al. |
| 7,385,654 B2 | 6/2008 | Mitsui et al. |
| 7,471,261 B2 | 12/2008 | Goto et al. |
| 7,608,531 B2 | 10/2009 | Isa et al. |
| 8,471,995 B2 | 6/2013 | Tseng et al. |
| 8,487,643 B2 | 7/2013 | Chen et al. |
| 8,610,155 B2 | 12/2013 | Hatano et al. |
| 8,723,824 B2 | 5/2014 | Myers et al. |
| 8,754,839 B2 | 6/2014 | Koyama |
| 8,976,141 B2 | 3/2015 | Myers et al. |
| 9,070,329 B2 | 6/2015 | Koyama |
| 9,287,329 B1 | 3/2016 | Lee et al. |
| 9,287,341 B2 | 3/2016 | Cheon et al. |
| 9,411,451 B2 | 8/2016 | Myers et al. |
| 9,430,180 B2 | 8/2016 | Hirakata et al. |
| 9,543,533 B2 | 1/2017 | Yamazaki et al. |
| 9,581,849 B2 | 2/2017 | Tanabe et al. |
| 9,582,043 B2 | 2/2017 | Hirakata |
| 2003/0201960 A1 | 10/2003 | Fujieda |
| 2005/0052340 A1 | 3/2005 | Goto et al. |
| 2006/0072047 A1 | 4/2006 | Sekiguchi |
| 2006/0231633 A1 | 10/2006 | Farooq et al. |
| 2008/0180618 A1 | 7/2008 | Fujieda |
| 2008/0283615 A1 | 11/2008 | Finn |
| 2009/0102822 A1 | 4/2009 | Goto et al. |
| 2010/0171905 A1 | 7/2010 | Huang et al. |
| 2011/0175102 A1 | 7/2011 | Hatano |
| 2013/0076649 A1 | 3/2013 | Myers et al. |
| 2014/0063719 A1 | 3/2014 | Yamazaki et al. |
| 2014/0065430 A1 | 3/2014 | Yamazaki et al. |
| 2014/0240289 A1 | 8/2014 | Myers et al. |
| 2014/0299874 A1 | 10/2014 | Yamazaki |
| 2014/0306260 A1 | 10/2014 | Yamazaki et al. |
| 2014/0319550 A1 | 10/2014 | Yamazaki et al. |
| 2015/0060896 A1 | 3/2015 | Okano et al. |
| 2015/0130767 A1 | 5/2015 | Myers et al. |
| 2015/0138072 A1 | 5/2015 | Yamazaki et al. |
| 2015/0144920 A1 | 5/2015 | Yamazaki et al. |
| 2015/0227227 A1 | 8/2015 | Myers et al. |
| 2016/0274398 A1 | 9/2016 | Hirakata et al. |
| 2016/0283028 A1 | 9/2016 | Yamazaki et al. |
| 2016/0299387 A1 | 10/2016 | Yamazaki et al. |

FOREIGN PATENT DOCUMENTS

| | | |
|---|---|---|
| JP | 2002-196702 A | 7/2002 |
| JP | 2002-328630 A | 11/2002 |
| JP | 2003-005670 A | 1/2003 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 | 10/2008 |
| JP | 2013-221965 A | 10/2013 |
| JP | 2014-535086 | 12/2014 |
| JP | 2015-127801 A | 7/2015 |
| JP | 2016-038490 A | 3/2016 |
| KR | 2015-0142157 A | 12/2015 |
| TW | 521241 | 2/2003 |
| TW | 200519823 | 6/2005 |
| TW | I419094 | 12/2013 |
| TW | 201519823 | 6/2015 |
| WO | WO-2004/053819 | 6/2004 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

Taiwanese Office Action (Application No. 105137658) dated Apr. 16, 2020.

Taiwanese Office Action (Application No. 105137658) dated Sep. 16, 2020.

Taiwanese Office Action (Application No. 105137658) dated Feb. 5, 2021.

FIG. 1A
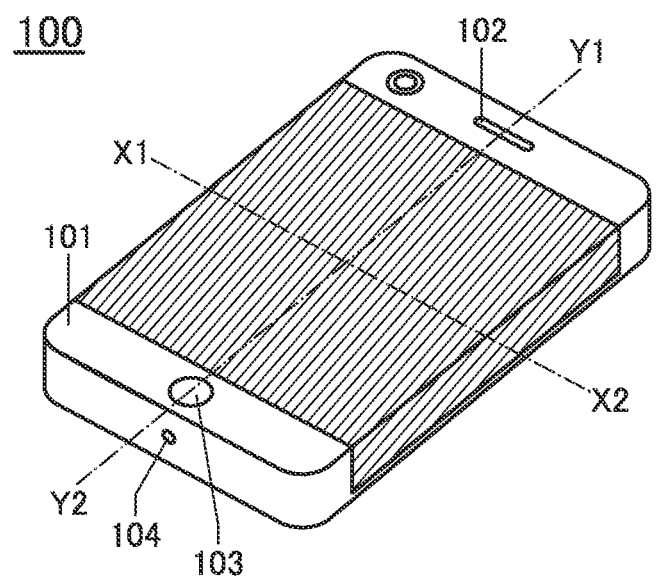
FIG. 1B  FIG. 1C  FIG. 1D
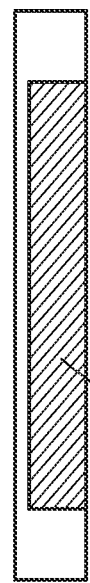 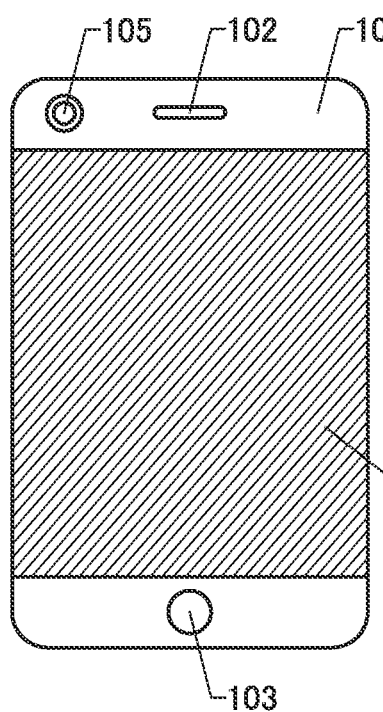 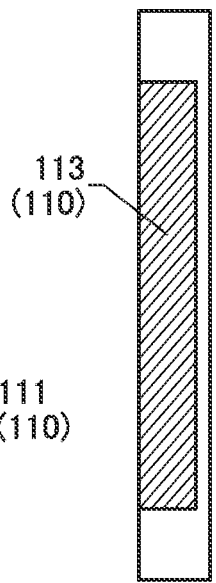

FIG. 9A
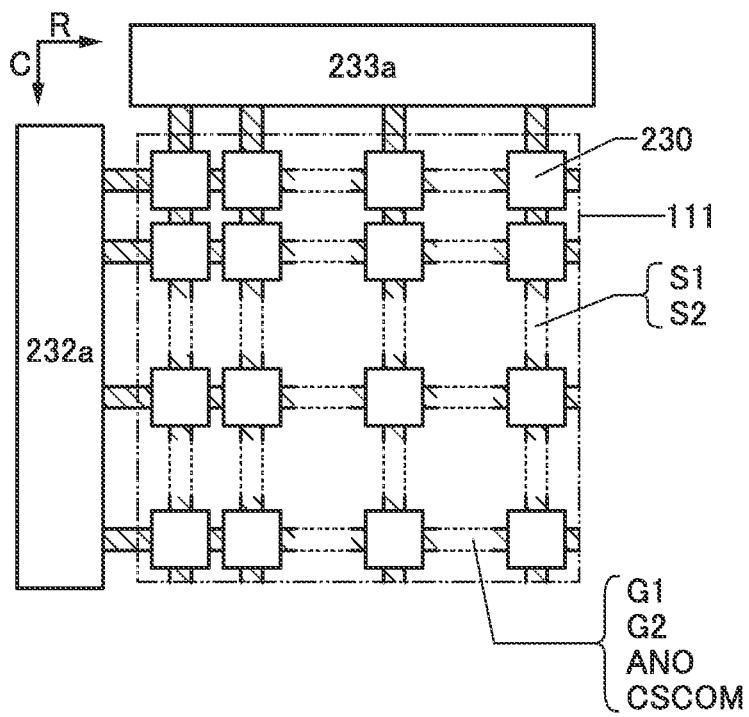
FIG. 9B1
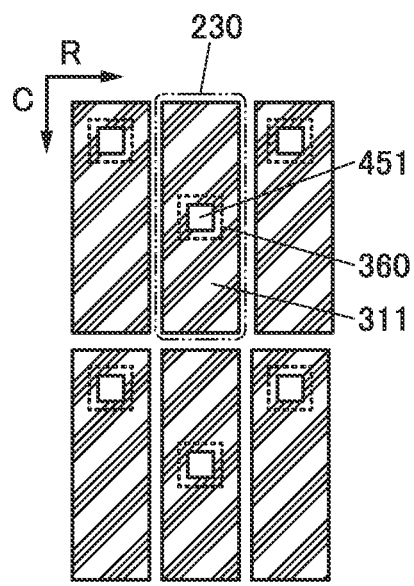
FIG. 9B2
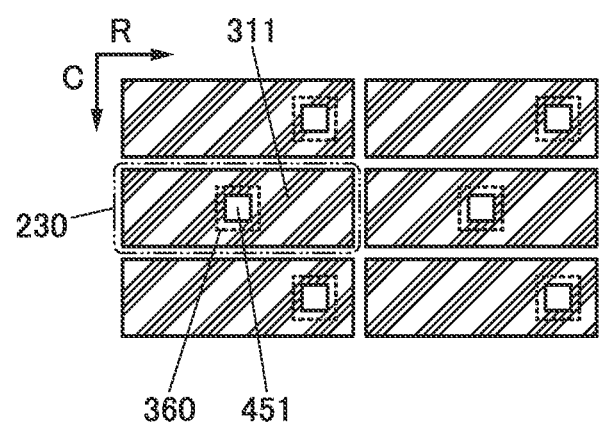

DISPLAY DEVICE AND ELECTRONIC DEVICE

BACKGROUND OF THE INVENTION

1. Field of the Invention

One embodiment of the present invention relates to an object, a method, or a manufacturing method. One embodiment of the present invention relates to a process, a machine, manufacture, or a composition of matter. One embodiment of the present invention relates to a semiconductor device, a display device, a light-emitting device, a lighting device, a power storage device, a memory device, a processor, a driving method thereof, or a manufacturing method thereof.

In this specification and the like, the term "semiconductor device" means all devices which can operate by utilizing semiconductor characteristics. For example, semiconductor elements (such as a diode and a transistor), semiconductor circuits, and the like are regarded as semiconductor devices. A display device, a light-emitting device, a lighting device, a photoelectric conversion device, a memory device, an imaging device, an electronic device, and the like may include a semiconductor device.

2. Description of the Related Art

In recent years, portable electronic devices such as smartphones and tablet terminals have been widespread. Patent document 1 discloses an electronic device in which a display device having flexibility (a flexible display) is bent so as to have display portions on a plurality of surfaces.

An active-matrix display device where a transistor for driving a display element is provided in each pixel is known as a display device. For example, an active-matrix liquid crystal display device that includes a liquid crystal element as a display element, an active-matrix light-emitting display device that includes a light-emitting element, such as an organic EL element, as a display element, and the like are known. These active-matrix display devices are easier to increase in display size or resolution than simple-matrix display devices, and have an advantage in reduced power consumption and the like.

REFERENCE

[Patent Document 1] Japanese Translation of PCT International Application No. 2014-535086

SUMMARY OF THE INVENTION

There has recently been a demand for portable electronic devices with a smaller size. To reduce the size of the electronic device disclosed in Patent Document 1, the bend portion of the flexible display needs to have a small radius of curvature. However, in the electronic device disclosed in Patent Document 1, the bend portion of the flexible display includes a display element, a wiring, and the like. Therefore, a decrease in the radius of curvature of the bend portion causes a short-circuit or a disconnection of the wiring or electrode included in the bend portion, easily leading to problems such as defective operation and lowered reliability.

There has also been a demand for portable electronic devices with lower power consumption. In particular, a decrease in the power consumption of a display device is demanded of devices using batteries as power sources, such as mobile phones, smartphones, tablet terminals, smart watches, and notebook personal computers, because the proportion of the power consumption of the display device to the total power consumption is large.

There is also a demand for portable electronic devices with high visibility both in an environment where external light illuminance is high and in an environment where external light illuminance is low.

When a portable electronic device is dropped or put in a trouser pocket or the like, its display device might be cracked in some cases. For this reason, there is a demand for shock-resistant, non-breakable display devices for use in electronic devices.

An object of one embodiment of the present invention is to provide a display device or the like having high display quality. Another object is to provide a highly reliable display device or the like. Another object is to provide a display device or the like with low power consumption. Another object is to provide a shock-resistant display device or the like. Another object is to provide a non-breakable display device or the like. Another object is to provide a lightweight display device or the like. Another object is to provide a display device or the like with high producibility. Another object is to provide a novel display device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device which includes a first display region, a second display region, a third display region, a first region, and a second region and has a function of bending in the first region and the second region. The first display region and the second display region are adjacent to each other with the first region therebetween. The second display region and the third display region are adjacent to each other with the second region therebetween. The first region includes no electrode for electrically connecting the first display region and the second display region to each other. The second region includes no electrode for electrically connecting the second display region and the third display region to each other.

One embodiment of the present invention is a display device which includes a first display region, a second display region, a third display region, a first region, and a second region and has a function of bending in the first region and the second region. The first display region and the second display region are adjacent to each other with the first region therebetween. The second display region and the third display region are adjacent to each other with the second region therebetween. The first region includes a first wiring for electrically connecting the first display region and the second display region to each other. The second region includes a second wiring for electrically connecting the second display region and the third display region to each other. The first wiring and the second wiring meander.

One embodiment of the present invention is a display device which includes a first display region, a second display region, and a first region. The first display region and the second display region are adjacent to each other with the first region therebetween. The first display region includes a first wiring, and the first wiring meanders. The first display region may include a curved surface.

One embodiment of the present invention is a display device which includes a first display region, a second display region, and a first region. The first display region and the second display region are adjacent to each other with the first region therebetween. The first display region includes a first wiring. The second display region includes a second wiring. The first region includes a third wiring. The first wiring is electrically connected to the third wiring. The second wiring is electrically connected to the third wiring. At least one of the first and third wirings meanders. The first display region may include a curved surface.

In one embodiment of the present invention, the above-described display device may include a first substrate and a second substrate. The first display region, the second display region, and the first region or the first display region, the second display region, the third display region, the first region, and the second region are provided between the first substrate and the second substrate. It is preferable that the first substrate and the second substrate each have flexibility.

Each of the first to third display regions includes a first display element and a second display element. The first display element has a function of reflecting visible light, and the second display element has a function of emitting visible light.

As the first display element, a liquid crystal element can be used, for example. As the second display element, an organic EL element can be used, for example.

One embodiment of the present invention is an electronic device which includes the display device and any of a touch sensor, an antenna, a battery, a housing, a speaker, a microphone, and an operation switch.

One embodiment of the present invention can provide a display device or the like having high display quality. Another embodiment can provide a highly reliable display device or the like. Another embodiment can provide a display device or the like with low power consumption. Another embodiment can provide a shock-resistant display device or the like. Another embodiment can provide a non-breakable display device or the like. Another embodiment can provide a lightweight display device or the like. Another embodiment can provide a display device or the like with high producibility. Another embodiment can provide a novel display device or the like.

Note that the description of these effects does not preclude the existence of other effects. One embodiment of the present invention does not necessarily achieve all the effects. Other effects are apparent from and can be derived from the description of the specification, the drawings, the claims, and the like.

BRIEF DESCRIPTION OF THE DRAWINGS

FIGS. 1A to 1D illustrate an electronic device.
FIGS. 9A, 9B1, and 9B2 illustrate one embodiment of the present invention.

DETAILED DESCRIPTION OF THE INVENTION

Figure 2A:
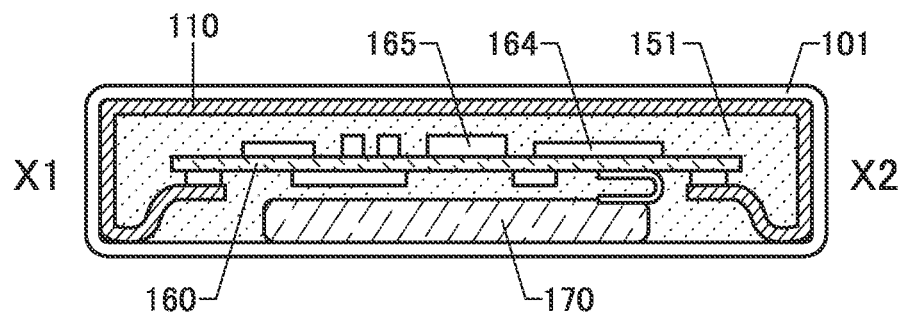
FIGS. 2A and 2B illustrate an electronic device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" provided in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used, there is a case in which no physical connection is made and a wiring is just extended in an actual circuit.

Note that the channel length refers to, for example, a distance from a source (source region or source electrode) to a drain (drain region or drain electrode) in a region where a semiconductor (or a portion where a current flows in a semiconductor when a transistor is on) and a gate electrode overlap with each other or a region where a channel is formed in a top view of the transistor. The channel length of a transistor is not necessarily constant in all regions. In other words, the channel length of one transistor is not limited to one value in some cases. Therefore, in this specification, the channel length is any one value, the maximum value, the minimum value, or the average value, in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In many cases, the extending direction of the channel length is orthogonal to the extending direction of the channel width. The channel width of a transistor is not necessarily constant in all regions. In other words, the channel width of one transistor is not fixed to one value in some cases. Therefore, in this specification, the channel width is any one value, the maximum value, the minimum value, or the average value in a region where a channel is formed.

Depending on the transistor structure, the channel width in a region where a channel is actually formed (hereinafter also referred to as an effective channel width) is different from the channel width shown in a top view of the transistor (hereinafter also referred to as an apparent channel width) in some cases. For example, in a transistor having a gate electrode covering side surfaces of a semiconductor layer, an effective channel width is greater than an apparent channel width, and its influence cannot be ignored in some cases. For example, in a miniaturized transistor having a gate electrode covering side surfaces of a semiconductor, the proportion of a channel formation region formed in the side surfaces of the semiconductor is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, a value different from the one obtained in the case where an effective channel width is used for the calculation is obtained in some cases.

Note that the term "impurity" in a semiconductor refers to, for example, an element other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include elements other than the main components of the oxide semiconductor, such as Group 1 elements, Group 2 elements, Group 13 elements, Group 14 elements, Group 15 elements, and transition metals; there are hydrogen, lithium, sodium, silicon, boron, phosphorus, carbon, and nitrogen, for example.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In the specification and the like, the terms "identical," "the same," "equal," "uniform," and the like (including synonyms thereof) used in describing calculation values and actual measurement values allow for a margin of error of ±20% unless otherwise specified.

In this specification and the like, in the case where an etching step (a removing step) is performed after a resist mask is formed by a photolithography method, the resist mask is removed after the etching step, unless otherwise specified.

In this specification and the like, a high power supply potential VDD (also referred to as "VDD" or "H potential") is a power supply potential higher than a low power supply potential VSS (also referred to as "VSS" or "L potential"). The low power supply potential VSS is a power supply potential lower than the high power supply potential VDD. In addition, a ground potential (also referred to as "GND" or "GND potential") can be used as VDD or VSS. For example, in the case where a ground potential is used as VDD, VSS is lower than the ground potential, and in the case where a ground potential is used as VSS, VDD is higher than the ground potential.

Note that the terms "film" and "layer" can be interchanged with each other depending on the case or circumstances. For example, the term "conductive film" can be changed into the term "conductive layer" in some cases. Also, the term "insulating film" can be changed into the term "insulating layer" in some cases.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

A transistor described in this specification and the like refers to an enhancement-mode (normally-off) field-effect transistor, unless otherwise specified. A transistor described in this specification and the like also refers to an n-channel transistor, unless otherwise specified. Therefore, the threshold voltage (also referred to as "$V_{th}$") thereof is higher than 0 V, unless otherwise specified.

Note that the $V_{th}$ of a transistor including a back gate in this specification and the like refers to a $V_{th}$ obtained when the potential of the back gate is set equal to that of a source or a gate, unless otherwise specified.

Unless otherwise specified, the off-state current in this specification and the like refers to a drain current of a transistor in the off state (also referred to as "non-conduction state" and "cutoff state"). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean there is a $V_{gs}$ at which the off-state current of the transistor is lower than or equal to I. The off-state current of a transistor may refer to off-state current at a given $V_{gs}$, at $V_{gs}$ in a given range, or at $V_{gs}$ at which sufficiently low off-state current is obtained, for example.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is a $V_{gs}$ at which the drain current of the transistor is $1\times10^{-22}$ A or lower, it may be said that the off-state current of the transistor is $1\times10^{-22}$ A or lower.

The off-state current of a transistor depends on temperature in some cases. Unless otherwise specified, the off-state current in this specification may be an off-state current at room temperature (RT), 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., a temperature higher than or equal to 5° C. and lower than or equal to 35° C.). The state in which the off-state current of a transistor is I or lower may indicate that the off-state current of the transistor at RT, 60° C., 85° C., 95° C., 125° C., a temperature at which the reliability of a semiconductor device or the like including the transistor is ensured, or a temperature at which the semiconductor device or the like is used (e.g., a temperature higher than or equal to 5° C. and lower than or equal to 35° C.) is I or lower at a certain $V_{gs}$.

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like. The state in which the off-state current of a transistor is lower than or equal to I may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like is lower than or equal to I at a certain $V_{gs}$.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is, in the case where a metal oxide has at least one of amplifying, rectifying, and switching effects, the metal oxide can be referred to as a metal oxide semiconductor (OS, for short). In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. Note that CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

Embodiment 1

In this embodiment, a display device of one embodiment of the present invention will be described with reference to drawings.

<Electronic Device 100>

Figure 2B:
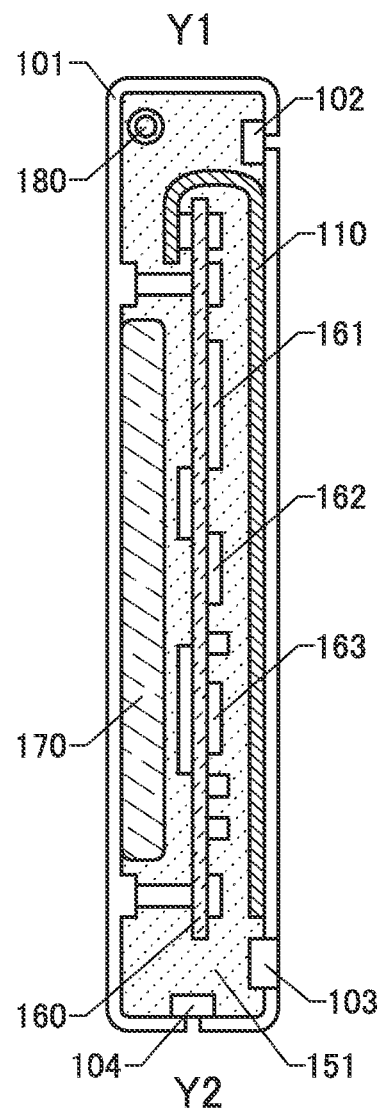

FIG. 1A is a perspective view of a portable electronic device 100 including the display device of one embodiment of the present invention. FIG. 1B is a left side view of the electronic device 100. FIG. 1C is a front view of the electronic device 100. FIG. 1D is a right side view of the electronic device 100. FIG. 2A is a cross-sectional view of a portion indicated by dashed-dotted line X1-X2 in FIG. 1A. FIG. 2B is a cross-sectional view of a portion indicated by dashed-dotted line Y1-Y2 in FIG. 1A.

The electronic device 100 includes a housing 101, an audio output device 102, an operation switch 103, an audio input device 104, an imaging device 105, a display device 110, and the like. The display device 110 includes a display region 111 overlapping with the front of the electronic device 100, a display region 112 overlapping with the left side of the electronic device 100, and a display region 113 overlapping with the right side of the electronic device 100.

The electronic device 100 also includes a circuit board 160, a battery 170, an antenna 180, and the like (see FIGS. 2A and 2B). The circuit board 160 is provided with an arithmetic device 161, a communication device 162, a memory device 163, a display portion control device 164, an orientation determination portion 165, and the like. Note that another semiconductor device or the like may be provided in a region 151 inside the housing 101. In addition, a functional member such as a member for dissipating heat, a member for absorbing or blocking electromagnetic waves, and/or a member for blocking magnetism may be provided in the region 151.

[Hardware Configuration Example]

A hardware configuration example that can be applied to the electronic device 100 will be described below.

Figure 3:
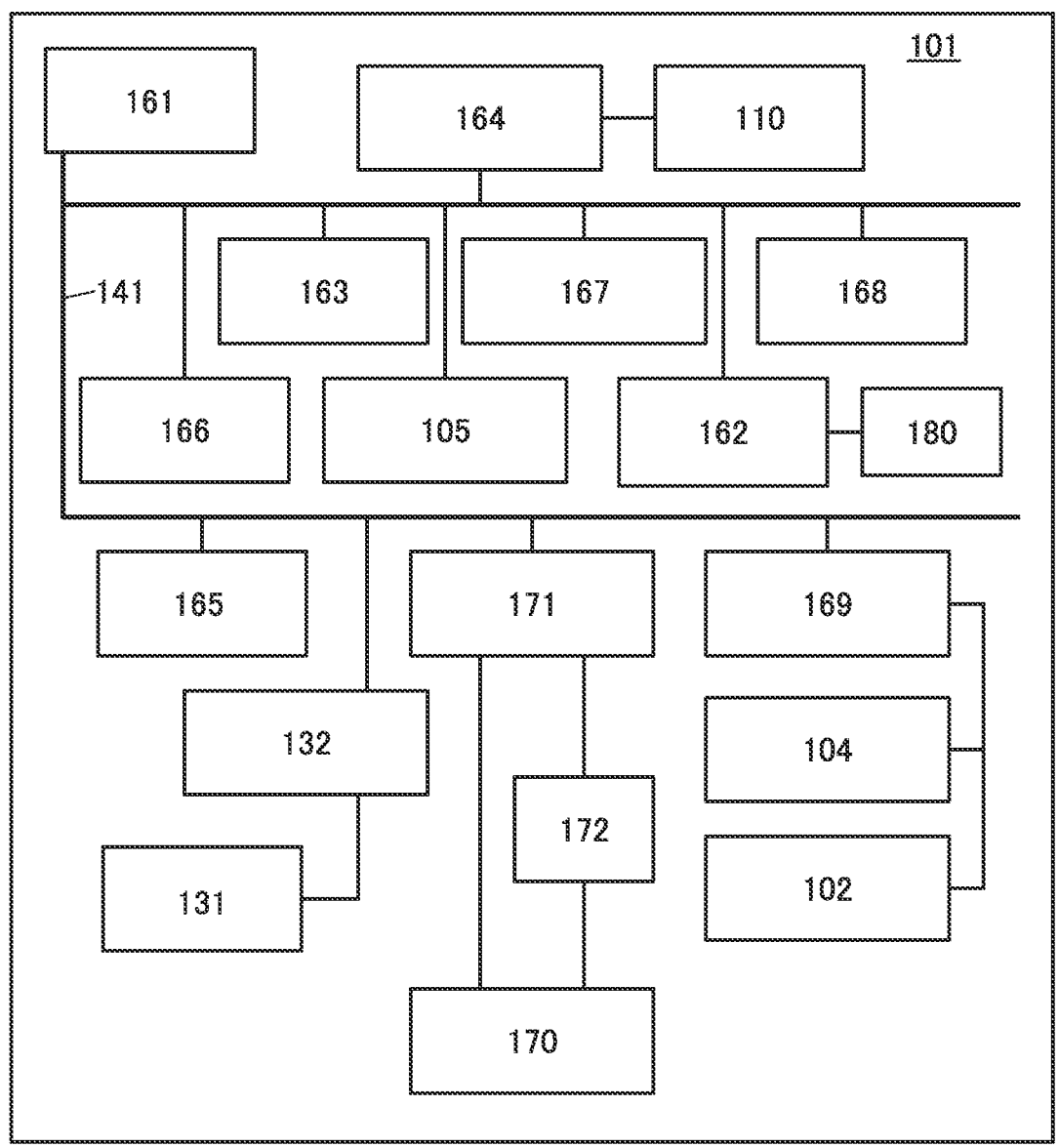
FIG. 3 is a block diagram illustrating an electronic device.

FIG. 3 is a block diagram illustrating a configuration example that can be applied to the electronic device 100.

Although a block diagram attached to this specification shows elements classified according to their functions in independent blocks, it may be practically difficult to completely separate the elements according to their functions and, in some cases, one element may be involved in a plurality of functions, or a plurality of elements may be involved in one function.

The configuration of the electronic device 100 illustrated in FIG. 3 is a mere example, and the electronic device 100 does not need to include all the components. The electronic device 100 includes necessary components among the components illustrated in FIG. 3 and may include a component other than the components in FIG. 3.

The electronic device 100 can include the display device 110, the arithmetic device 161, a touch sensor 131, the memory device 163, the display portion control device 164, a touch sensor controller 132, a battery controller 171, a power reception portion 172, the battery 170, a sound controller 169, the audio input device 104, the audio output device 102, the communication device 162, the antenna 180, the orientation determination portion 165, an external interface 168, the imaging device 105, a vibration device 166, a sensor module 167, and the like.

The memory device 163, the display portion control device 164, the touch sensor controller 132, the battery controller 171, the sound controller 169, the communication device 162, the orientation determination portion 165, the external interface 168, the imaging device 105, the vibration device 166, the sensor module 167, and the like are each connected to the arithmetic device 161 through a bus line 141.

The touch sensor 131 may overlap with the display device 110. The display device 110 may have a function of the touch sensor 131.

The arithmetic device 161 can function as, for example, a central processing unit (CPU). The arithmetic device 161 has a function of controlling components such as the touch sensor controller 132, the battery controller 171, the sound controller 169, the communication device 162, the orientation determination portion 165, the external interface 168, the imaging device 105, the vibration device 166, and the sensor module 167. The arithmetic device 161 may have functions of the memory device 163, the display portion control device 164, and the like.

Signals are transmitted between the arithmetic device 161 and the components via the bus line 141. The arithmetic device 161 has a function of processing signals input from the components which are connected through the bus line 141, a function of generating signals to be output to the components, and the like, so that the components connected to the bus line 141 can be controlled comprehensively.

Note that a transistor that includes an oxide semiconductor, which is one type of a metal oxide, in a semiconductor layer where a channel is formed and that has an extremely low off-state current can be used in an IC or the like included in the arithmetic device 161 or another component. With the use of the transistor having an extremely low off-state current as a switch for holding electric charge (data) which flows into a capacitor serving as a memory element, a long data retention period can be ensured. By utilizing this characteristic for a register or a cache memory of the arithmetic device 161, normally-off computing is achieved where the arithmetic device 161 operates only when needed and data on the previous processing is stored in the memory element in the rest of time; thus, power consumption of the electronic device 100 can be reduced.

The arithmetic device 161 interprets and executes instructions from various programs with a processor to process various kinds of data and control programs. The programs that can be executed by the processor may be stored in a memory region of the processor or in the memory device 163.

A CPU and another microprocessor such as a digital signal processor (DSP) or a graphics processing unit (GPU) can be used alone or in combination as the arithmetic device 161. Furthermore, such a microprocessor may be obtained with a programmable logic device (PLD) such as a field programmable gate array (FPGA) or a field programmable analog array (FPAA).

The arithmetic device 161 may include a main memory. The main memory can include a volatile memory, such as a random access memory (RAM), and a nonvolatile memory, such as a read only memory (ROM).

For example, a dynamic random access memory (DRAM) is used for the RAM included in the main memory, in which case a memory space as a workspace for the arithmetic device 161 is virtually allocated and used. An operating system, an application program, a program module, program data, and the like which are stored in the memory device 163 are loaded into the RAM and executed. The data, program, and program module which are loaded into the RAM are directly accessed and operated by the arithmetic device 161.

In the ROM, a basic input/output system (BIOS), firmware, and the like for which rewriting is not needed can be stored. As the ROM, a mask ROM, a one-time programmable read only memory (OTPROM), or an erasable programmable read only memory (EPROM) can be used. As an EPROM, an ultra-violet erasable programmable read only memory (UV-EPROM) which can erase stored data by irradiation with ultraviolet rays, an electrically erasable programmable read only memory (EEPROM), a flash memory, and the like can be given.

Examples of the memory device 163 are a memory device including a nonvolatile memory element, such as a flash memory, a magnetoresistive random access memory (MRAM), a phase change RAM (PRAM), a resistive RAM (ReRAM), or a ferroelectric RAM (FeRAM); a memory device including a volatile memory element, such as a dynamic RAM (DRAM) or a static RAM (SRAM); and the like. Furthermore, a memory media drive such as a hard disk drive (HDD) or a solid state drive (SSD) may be used.

As the memory device 163, a memory device which can be connected and disconnected through the external interface 168 with a connector, such as an HDD or an SSD; or a memory media drive, such as a flash memory, a Blu-ray disc, or a DVD can be used. Note that the memory device 163 is not necessarily incorporated in the electronic device 100, and a memory device outside the electronic device 100 may be used as the memory device 163. In that case, the memory device may be connected through the external interface 168, or data transmission and reception may be wirelessly performed using the communication device 162.

The display portion control device 164 is connected to the arithmetic device 161 through the bus line 141. The display portion control device 164 is connected to the display device 110. The display portion control device 164 has a function of controlling the display device 110 according to drawing instructions input from the arithmetic device 161 so that the display device 110 displays a predetermined image.

The touch sensor 131 is connected to the touch sensor controller 132. The touch sensor controller 132 is connected to the arithmetic device 161 through the bus line 141.

The touch sensor controller 132 controls the touch sensor 131 according to requests from the arithmetic device 161 via the bus line 141. In addition, the touch sensor controller 132 outputs a signal received by the touch sensor to the arithmetic device 161 via the bus line 141. Note that the function of calculating touch position data from a signal received by the touch sensor may be given to the touch sensor controller 132 or the arithmetic device 161.

The touch sensor 131 is capable of sensing the proximity or touch of an object to be sensed, such as a finger or a stylus, in accordance with a signal supplied from the touch sensor controller 132 and outputting the positional information on the object to the touch sensor controller 132.

The touch sensor 131 and the touch sensor controller 132 preferably have a function of obtaining the distance between a sensing surface and the object in the height direction, a function of obtaining the level of pressure applied to the sensing surface by the object, and a function of obtaining the size of the surface of the sensing surface that is in contact with the object.

A module including the touch sensor 131 can be provided on the display surface side of the display panel so as to overlap with the display panel. In that case, at least a portion of the module including the touch sensor is preferably flexible to follow the bending of the display panel. The module including the touch sensor can be bonded to the display panel with an adhesive or the like. A polarizing plate or a cushion material (e.g., a separator) may be provided between the module and the display panel. The thickness of the module including the touch sensor is preferably smaller than or equal to that of the display panel.

A touch panel in which a display device and a touch sensor are combined may be used as the touch sensor 131. For example, an on-cell touch panel or an in-cell touch panel is preferable. The on-cell or in-cell touch panel can be thin and lightweight. The on-cell or in-cell touch panel has fewer components and can therefore reduce cost.

A variety of sensors that can sense proximity or touch of a sensing target such as a finger can be used as the touch sensor 131. For example, a sensor of a capacitive type, a resistive type, a surface acoustic wave type, an infrared type, an electromagnetic induction type, an optical type, or the like can be used. Alternatively, an optical sensor using a photoelectric conversion element, a pressure-sensitive sensor using a pressure-sensitive element, or the like may be used. Sensors of two or more different types may be included, or two or more sensors of the same type may be included.

For example, a capacitive touch sensor includes a pair of conductive layers. The pair of conductive layers is capacitively coupled. The capacitance between the pair of conductive layers changes when an object touches, presses, or approaches the pair of conductive layers. Utilizing this effect, detection can be conducted.

Examples of the capacitive touch sensor include a surface capacitive touch sensor and a projected capacitive touch sensor. Examples of the projected capacitive touch sensor are a self-capacitive touch sensor and a mutual capacitive touch sensor, which differ mainly in the driving method. The use of a mutual capacitive type is preferable because multiple points can be easily sensed simultaneously.

The battery controller 171 can manage a charge state of the battery 170. In addition, the battery controller 171 supplies power from the battery 170 to the components. The power reception portion 172 has a function of receiving power supplied from the outside and charging the battery 170. The battery controller 171 can control the operation of the power reception portion 172 depending on the charge state of the battery 170.

The battery 170 includes one or more primary batteries or secondary batteries, for example. Examples of the secondary battery which can be used for the battery 170 include a lithium-ion secondary battery and a lithium-ion polymer secondary battery. In addition to such a battery, the battery 170 may be provided with a protection circuit for preventing overcharge and overdischarge of the battery.

In the case of indoor use or the like, an alternating-current (AC) power supply may be used as an external power supply. Particularly in the case of using the electronic device 100 separately from the external power supply, it is favorable that the battery 170 have a large charge/discharge capacity which allows the electronic device 100 to be used for a long time. The battery 170 may be charged using a battery charger capable of supplying power to the electronic device 100. At this time, charging may be performed through wires using a universal serial bus (USB) connector, an AC adaptor, or the like; alternatively, charging may be performed by a wireless power feeding method such as an electric field coupling method, an electromagnetic induction method, or an electromagnetic resonance (electromagnetic resonant coupling) method.

The battery controller 171 may include a battery management unit (BMU), for example. The BMU collects data on cell voltage or cell temperatures of the battery, monitors overcharge and overdischarge, controls a cell balancer, handles a deterioration state of the battery, calculates the remaining battery power level (state of charge: SOC), and controls detection of a failure, for example.

The battery controller 171 controls power transmission from the battery 170 to the components through a power supply line (not illustrated). The battery controller 171 can include a power converter with a plurality of channels, an inverter, a protection circuit, and the like.

When the housing 101 in which the battery 170 is incorporated is flexible and can be used in a bent state, it is preferable that the battery 170 be also at least partly flexible. Examples of the secondary battery which can be used for the battery 170 include a lithium-ion secondary battery and a lithium-ion polymer secondary battery. It is preferable that a laminate pouch be used as an exterior package of the battery so that the battery has flexibility.

A film used for the laminate pouch is a single-layer film selected from a metal film (such as aluminum, stainless steel, or nickel steel), a plastic film made of an organic material, a hybrid material film containing an organic material (e.g., an organic resin or fiber) and an inorganic material (e.g., ceramic), and a carbon-containing inorganic film (e.g., a carbon film or a graphite film), or a stacked-layer film including two or more of the above films. A metal film can be easily embossed. Forming depressions or projections by embossing increases the surface area of the film exposed to outside air, achieving efficient heat dissipation.

It is particularly preferable that a laminate pouch including a metal film having depressions and projections by embossing be used, in which case a strain caused by stress applied to the laminate pouch can be relieved, leading to an effective decrease of defects such as a break of the laminate pouch due to bending of a secondary battery.

The battery controller 171 preferably has a function of reducing power consumption. For example, after detection of no input to the electronic device 100 for a given period, the battery controller 171 lowers clock frequency or stops input of clocks of the arithmetic device 161, stops operation of the arithmetic device 161 itself, stops operation of the auxiliary memory, and reduces power consumption by reducing power supply to the components. Such a function can be performed with the battery controller 171 alone or the battery controller 171 interlocking with the arithmetic device 161.

The audio input device 104 includes a microphone (mike), an audio input connector, or the like. The audio output device 102 includes a speaker, an audio output connector, or the like. The audio input device 104 and the audio output device 102 are each connected to the sound controller 169 and connected to the arithmetic device 161 via the bus line 141. Audio data input to the audio input device 104 is converted into a digital signal in the sound controller 169 and then processed in the sound controller 169 and the arithmetic device 161. The sound controller 169 generates an audio signal audible to a user according to instructions from the arithmetic device 161 and outputs the audio signal to the audio output device 102. To the audio output connector of the audio output device 102, an audio output device such as earphones, headphones, or a headset can be connected and a sound generated in the sound controller 169 is output to the device.

The communication device 162 can communicate via the antenna 180. For example, the communication device 162 controls a control signal for connecting the electronic device 100 to a computer network according to instructions from the arithmetic device 161 and transmits the signal to the computer network. Accordingly, communication can be performed by connecting the electronic device 100 to a computer network such as the Internet (which is an infrastructure of the World Wide Web (WWW)), an intranet, an extranet, a personal area network (PAN), a local area network (LAN), a campus area network (CAN), a metropolitan area network (MAN), a wide area network (WAN), or a global area network (GAN). When a plurality of communication methods are used, the electronic device 100 may have a plurality of antennas 180 for the communication methods.

For example, a high frequency circuit (an RF circuit) is included in the communication device 162 for receiving and transmitting an RF signal. The RF circuit performs conversion between an electromagnetic signal and an electric signal in a frequency band which is set by a national law, and performs communication with another communication device wirelessly with the use of the electromagnetic signal. Several tens of kilohertz to several tens of gigahertz are a practical frequency band which is generally used. The RF circuit connected to the antenna 180 includes a circuit portion which is compatible with a plurality of frequency bands; the circuit portion can include an amplifier, a mixer, a filter, a DSP, an RF transceiver, or the like. In the case of performing wireless communication, it is possible to use, as a communication protocol or a communication technology, a communications standard such as Long Term Evolution (LTE), Global System for Mobile Communication (GSM) (registered trademark), Enhanced Data Rates for GSM Evolution (EDGE), Code Division Multiple Access 2000 (CDMA2000), or Wideband Code Division Multiple Access (W-CDMA) (registered trademark), or a communications standard developed by IEEE such as Wi-Fi (registered trademark), Bluetooth (registered trademark), or ZigBee (registered trademark).

The communication device 162 may have a function of connecting the electronic device 100 to a telephone line. In the case of a phone call through a telephone line, the communication device 162 controls a connection signal according to instructions from the arithmetic device 161 and transmits the signal to the telephone line. The connection signal is a signal for connecting the electronic device 100 to the telephone line.

The communication device 162 may include a tuner for generating a video signal from airwaves received by the antenna 180. The video signal is output to the display device 110. The tuner includes, for example, a demodulation circuit, an AD converter circuit (analog-digital converter circuit), a decoder circuit, and the like. The demodulation circuit has a function of demodulating a signal input from the antenna 180. The AD converter circuit has a function of converting the demodulated analog signal into a digital signal. The decoder circuit has a function of decoding video data contained in the digital signal and generating a signal to be transmitted to the display portion control device 164.

The decoder may include a dividing circuit and a plurality of processors. The dividing circuit has a function of dividing the input video data spatiotemporally and outputting it to the processors. The plurality of processors decode the input video data and generate signals to be transmitted to the display portion control device 164. Since the decoder includes the plurality of processors which perform parallel data processing, video data containing enormous amounts of information can be decoded. In particular, in the case of displaying an image with a resolution higher than the full high definition, the decoder circuit for decoding compressed data preferably includes a processor having extremely high-speed processing capability. The decoder circuit preferably includes a plurality of processors capable of performing 4 or more, preferably 8 or more, further preferably 16 or more parallel operations. The decoder may include a circuit for separating a signal used for an image and contained in the input signal from other signals (e.g., text data, broadcast program data, and certification data).

The antenna 180 can receive airwaves such as a ground wave and a satellite wave. The antenna 180 can receive airwaves for analog broadcasting, digital broadcasting, image-and-sound broadcasting, sound-only broadcasting, or the like. For example, the antenna 180 can receive airwaves transmitted in a certain frequency band, such as a UHF band (about 300 MHz to 3 GHz) or a VHF band (30 MHz to 300 MHz). When a plurality of pieces of data received in a plurality of frequency bands are used, the transfer rate can be increased and more information can thus be obtained. Accordingly, the display device 110 can display an image with a resolution higher than the full high definition, such as 4K2K, 8K4K, 16K8K, or more.

Alternatively, the tuner may be configured to generate a signal using broadcasting data transmitted with data transmission technology through a computer network. The signal is transmitted to the display portion control device 164. In the case where the tuner receives a digital signal, the tuner does not necessarily include the demodulation circuit and the AD converter circuit.

The orientation determination portion 165 has a function of detecting a tilt, an orientation, and the like of the electronic device 100. For example, an acceleration sensor, an angular velocity sensor, a vibration sensor, a pressure sensor, a gyroscope sensor, or the like can be used for the orientation determination portion 165. Alternatively, these sensors may be combined to be used.

Examples of the external interface 168 include one or more buttons or switches provided on the housing 101 (also referred to as housing switches) and one or more external ports to which another input component can be connected. The external interface 168 is connected to the arithmetic device 161 via the bus line 141. Examples of the housing switches include a switch associated with powering on/off, a button for adjusting volume, and a camera button.

The external port of the external interface 168 can be connected to an external device such as a computer or a printer through a cable. A USB terminal is a typical example. As the external port, a local area network (LAN) connection terminal, a digital broadcasting reception terminal, an AC adaptor connection terminal, or the like may be provided. A transceiver for optical communication, without limitation to wire communication, using infrared rays, visible light, ultraviolet rays, or the like may be provided.

The imaging device 105 is connected to the arithmetic device 161 via the bus line 141. The imaging device 105 can take a still image or a moving image in synchronization with pushing a switch provided on the housing or touching the touch sensor 131. The imaging device 105 may include a light source for taking images. For example, a lamp such as a xenon lamp, a light-emitting element such as an LED or an organic EL element, or the like can be used. Alternatively, the display device 110 may be used as the light source for taking images, in which case not only white light but also light of various colors may be used for taking images.

The vibration device 166 includes a vibrating element for vibrating the electronic device 100 and a vibration controller for controlling the vibrating element. As the vibrating element, an element capable of converting an electric signal or a magnetic signal into vibration, such as a vibration motor (eccentric motor), a resonant actuator, a magnetostrictive element, or a piezoelectric element can be used.

The vibration device 166 can vibrate the electronic device 100 in a variety of vibration patterns by controlling the number of vibrations, the amplitude, vibration time, and the like of the vibrating element according to instructions from the arithmetic device 161. The vibration device 166 can generate vibration in a variety of vibration patterns based on operation executed by a variety of applications. Examples of such vibration include vibration linked with operation of the housing switch or the like, vibration linked with startup of the electronic device 100, vibration linked with a moving image or a sound reproduced by an application for reproducing a moving image, vibration linked with reception of an e-mail, and vibration linked with input operation to the touch sensor 131.

The sensor module 167 includes a sensor unit and a sensor controller. The sensor controller supplies electric power from the battery 170 or the like to the sensor unit. Moreover, the sensor controller converts the input from the sensor unit into a control signal and outputs it to the arithmetic device 161 via the bus line 141. The sensor controller may handle errors made by the sensor unit or may calibrate the sensor unit. Note that the sensor controller may include a plurality of controllers which control the sensor unit.

The sensor module 167 may include any of a variety of sensors which have a function of measuring force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, or infrared rays.

The above is the description of one example of hardware configuration that can be applied to the electronic device 100.

<Display Device 110>

Figure 4A:
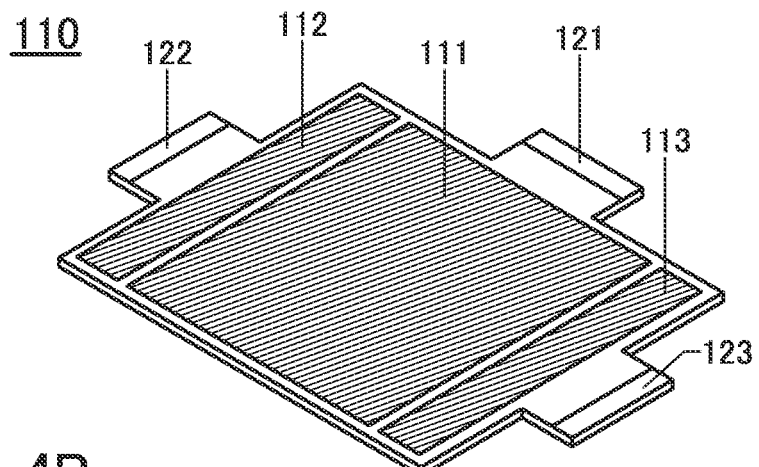
FIGS. 4A and 4B illustrate one embodiment of the present invention.
Figure 4B:
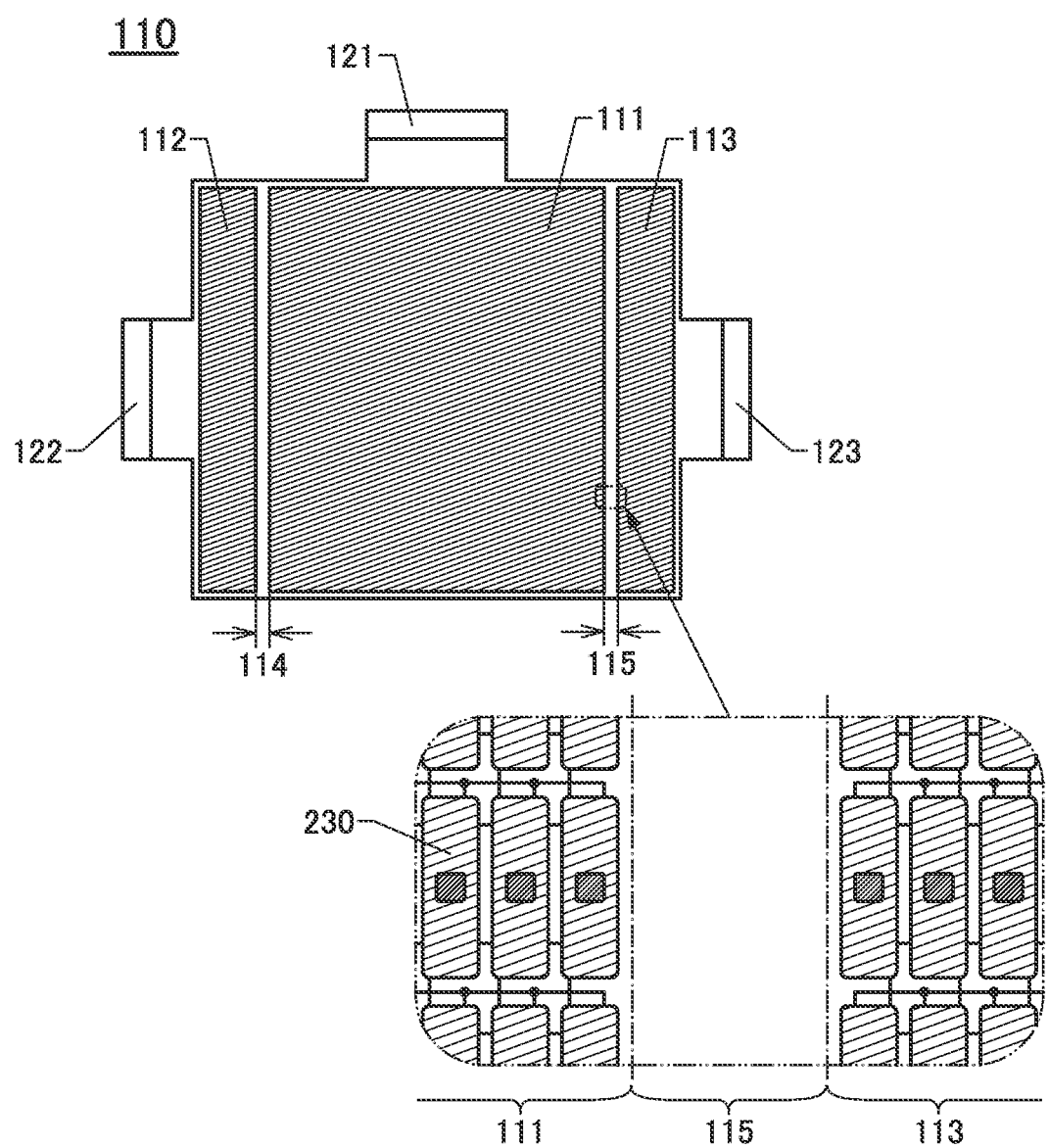

FIG. 4A is a perspective view of the display device 110. FIG. 4B is a plan view of the display device 110. As described above, the display device 110 includes the display region 111, the display region 112, and the display region 113. The display region 111, the display region 112, and the display region 113 each include a plurality of pixels 230 arranged in a matrix.

Using the pixels 230 arranged in a 1920×1080 matrix, the display device 110 can display an image with "full high definition" (also referred to as "2K resolution," "2K1K," "2K," and the like). Using the pixels 230 arranged in a 3840×2160 matrix, the display device 110 can display an image with "ultra high definition" (also referred to as "4K resolution," "4K2K," "4K," and the like). Using the pixels 230 arranged in a 7680×4320 matrix, the display device 110 can display an image with "super high definition" (also referred to as "8K resolution," "8K4K," "8K," and the like). Using a larger number of pixels, the display device 110 can display an image with 16K or 32K resolution.

The display device 110 includes an input terminal 121, an input terminal 122, and an input terminal 123. The input terminal 121 is electrically connected to the display region 111. The input terminal 122 is electrically connected to the display region 112. The input terminal 123 is electrically connected to the display region 113.

The input terminal 121, the input terminal 122, and the input terminal 123 are electrically connected to the display portion control device 164. The display portion control device 164 has a function of supplying a signal for displaying an image to each of the display regions 111, 112, and 113.

A signal for displaying an image in the display region 111 is supplied to the display region 111 through the input terminal 121. A signal for displaying an image in the display region 112 is supplied to the display region 112 through the input terminal 122. A signal for displaying an image in the display region 113 is supplied to the display region 113 through the input terminal 123.

The input terminal 121, the input terminal 122, and the input terminal 123 are bent inside the housing 101 and electrically connected to the display portion control device 164 provided on the circuit board 160.

The display device 110 includes a bend region 114 between the display region 111 and the display region 112 and a bend region 115 between the display region 111 and the display region 113. When the display device 110 is bent in the bend region 114 and the bend region 115 and located in the housing 101, the display region 111 can be located to overlap with the front of the electronic device 100. The display region 112 can be located to overlap with the left side of the electronic device 100. The display region 113 can be located to overlap with the right side of the electronic device 100.

A wiring or an electrode for transmitting a signal to the display region 111, the display region 112, and/or the display region 113 is not provided in the bend region 114 and the bend region 115. In particular, a wiring or an electrode for electrically connecting the display region 111 and the display region 112 to each other is not provided in the bend region 114. Furthermore, a wiring or an electrode for electrically connecting the display region 111 and the display region 113 to each other is not provided in the bend region 115.

Figure 5:
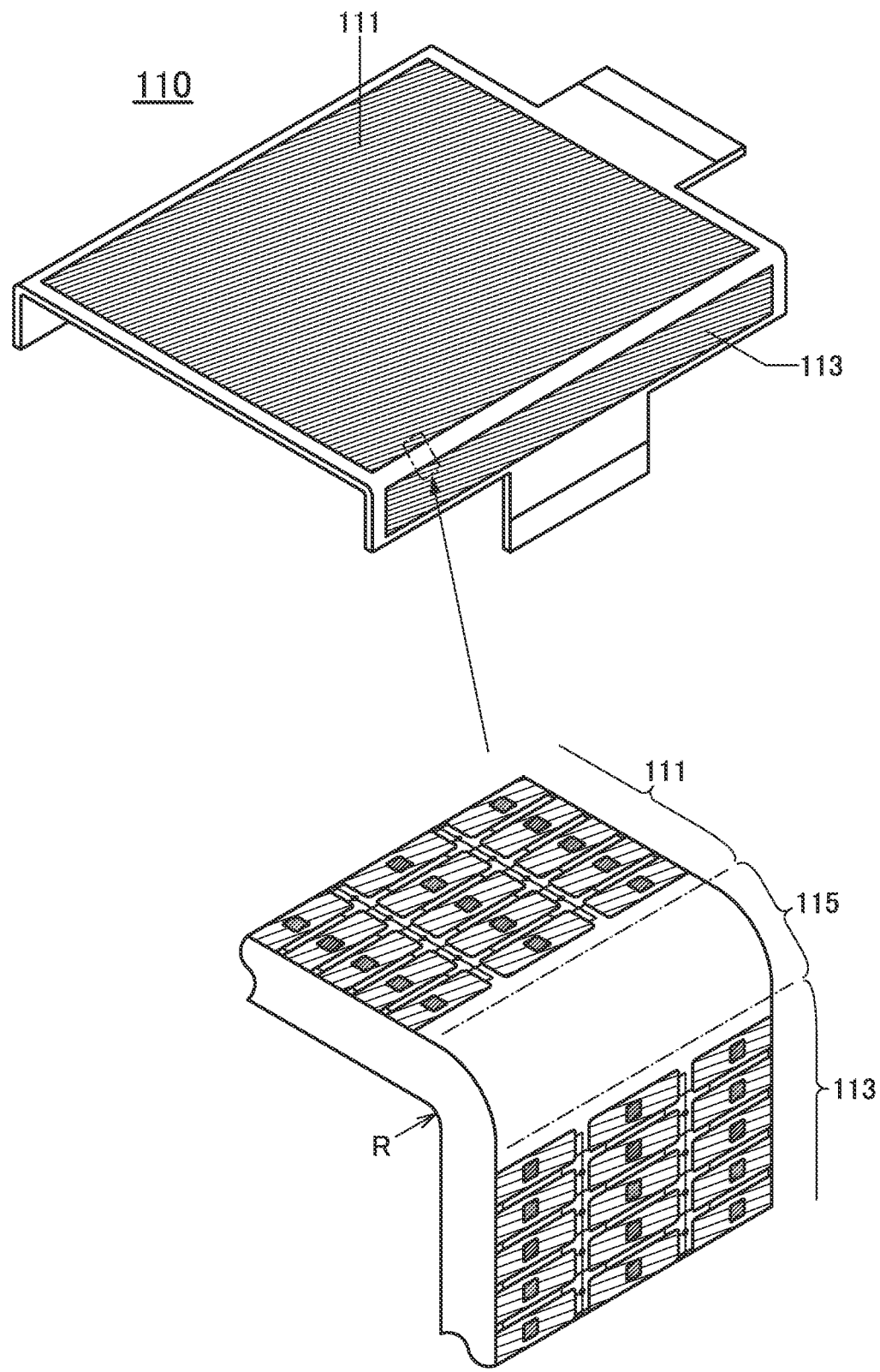
FIG. 5 illustrates one embodiment of the present invention.

FIG. 5 illustrates a perspective view of the display device 110 which is bent in the bend region 114 and the bend region 115. Since a wiring or an electrode is not provided in the bend region 114 and the bend region 115, even when the curvature radius R of the bend portion is decreased, defective operation, lowered reliability, or the like of the display device 110 due to a short-circuit or a disconnection of a wiring or an electrode or the like does not occur. Specifically, the curvature radius R can be less than or equal to 1 mm. Alternatively, the curvature radius R can be less than or equal to 0.5 mm. Alternatively, the curvature radius R can be less than or equal to 0.1 mm.

This embodiment can be implemented in appropriate combinations with any of the other embodiments.

Embodiment 2

In this embodiment, more specific configuration examples of the display device 110 of one embodiment of the present invention will be described.

Figure 6A:
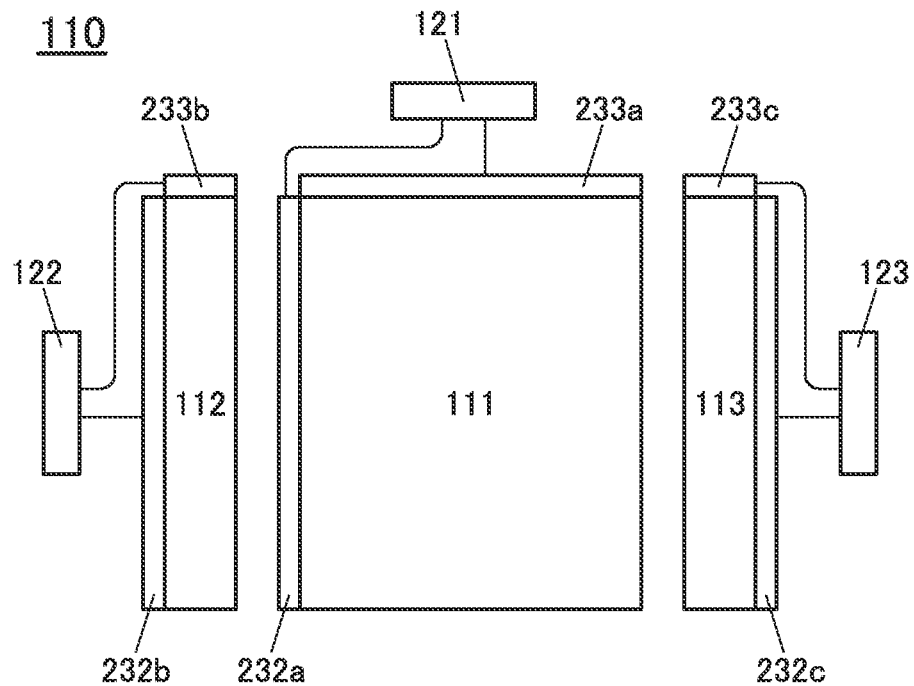
FIGS. 6A and 6B illustrate one embodiment of the present invention.

FIG. 6A is a block diagram illustrating a configuration example of the display device 110. The display device 110 may include a circuit 232a between the input terminal 121 and the display region 111, a circuit 233a between the input terminal 121 and the display region 111, a circuit 232b between the input terminal 122 and the display region 112, a circuit 233b between the input terminal 122 and the display region 112, a circuit 232c between the input terminal 123 and the display region 113, and a circuit 233c between the input terminal 123 and the display region 113.

The circuit 232a, the circuit 232b, and the circuit 232c may each function as, for example, a scan line driver circuit. The circuit 233a, the circuit 233b, and the circuit 233c may each function as, for example, a signal line driver circuit. In some cases, the circuit 232a, the circuit 232b, the circuit 232c, the circuit 233a, the circuit 233b, and the circuit 233c are collectively referred to as a driver circuit portion. Note that the driver circuit portion may be provided in the display regions.

Figure 7A:
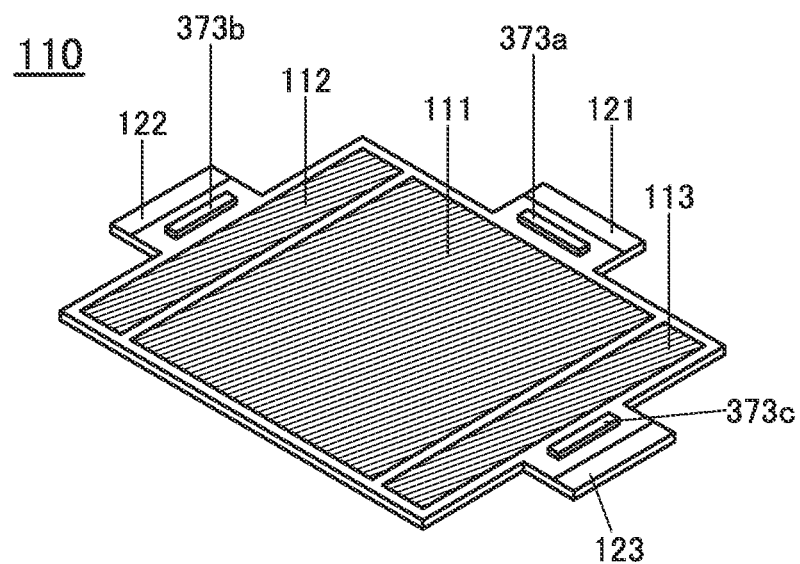
FIGS. 7A and 7B illustrate one embodiment of the present invention.

Part of the driver circuit portion or the entire driver circuit portion may be mounted as an IC on the display device 110. FIG. 7A is a perspective view of the display device 110 on which an IC 373a, an IC 373b, and an IC 373c are mounted by a chip-on-film (COF) method or the like.

Figure 7B:
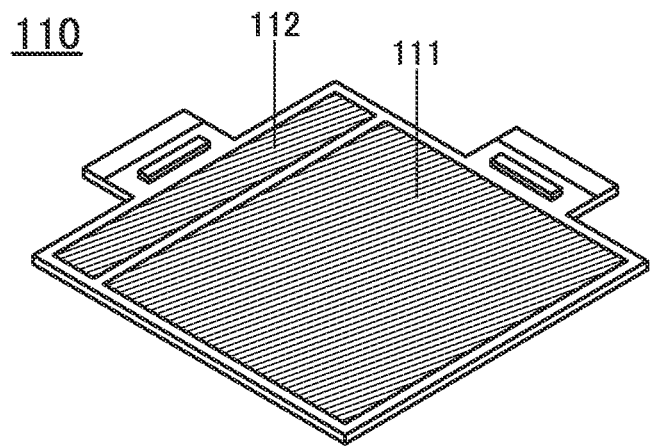

Note that at least one of the display regions 112 and 113 is not necessarily provided. FIG. 7B is a perspective view of the display device 110 which is not provided with the display region 113.

Next, configuration examples of the display region 111, the circuit 232a, and the circuit 233a are described. Note that the display region 112, the circuit 232b, and the circuit 233b and the display region 113, the circuit 232c, and the circuit 233c may have configurations similar to those of the display region 111, the circuit 232a, and the circuit 233a.

Configuration Example 1

Figure 6B:
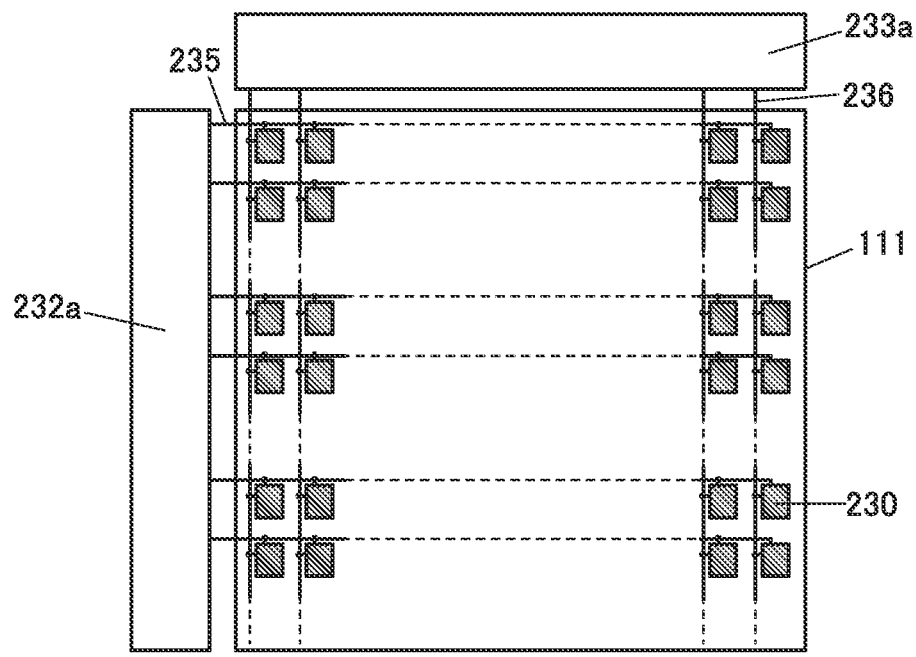

FIG. 6B is a block diagram illustrating a configuration example of the display region 111, the circuit 232a, and the circuit 233a.

The display region 111 includes m wirings 235 and n wirings 236. The m wirings 235 are arranged substantially parallel to each other, and potentials thereof are controlled by the circuit 232a. The n wirings 236 are arranged substantially parallel to each other, and potentials thereof are controlled by the circuit 233a. The display region 111 includes the plurality of pixels 230 arranged in a matrix.

Each of the wirings 235 is electrically connected to the n pixels 230 in the corresponding row among the pixels 230 arranged in m rows and n columns in the display region 111. Each of the wirings 236 is electrically connected to the m pixels 230 in the corresponding column among the pixels 230 arranged in the m rows and the n columns. Note that m and n are each an integer of 1 or more.

The pixel 230 includes a pixel circuit 237 and a display element 225. The pixel circuit 237 is a circuit that drives the display element 225. A transistor included in the driver circuit portion and a transistor included in the pixel circuit 237 can be formed at the same time. That is, with the use of the transistor described in this specification and the like, part of the driver circuit portion or the entire driver circuit portion can be formed over a substrate where a pixel portion is formed, whereby a system-on-panel can be obtained.

Part of the driver circuit portion or the entire driver circuit portion may be formed over another substrate and electrically connected to the display device 110. For example, part of the driver circuit portion or the entire driver circuit portion may be formed using a single crystal substrate and electrically connected to the display device 110.

Full-color display can be achieved by making a pixel 230 that emits or reflects red light, a pixel 230 that emits or reflects green light, and a pixel 230 that emits or reflects blue light collectively function as one pixel and by controlling the amount of light emitted from each pixel. Thus, these three pixels function as sub-pixels. The colors of light emitted or reflected by the three sub-pixels are not limited to the combination of red, green, and blue and may be yellow, cyan, and magenta.

Four sub-pixels may collectively function as one pixel. For example, a sub-pixel that emits or reflects white light may be added to the three sub-pixels that emit or reflect red light, green light, and blue light. The addition of the sub-pixel that emits or reflects white light can increase the luminance of the display region. When sub-pixels that emit or reflect red, green, blue, yellow, cyan, magenta, and the like are combined as appropriate with more sub-pixels functioning as one pixel, the range of color reproduction can be increased.

[Display Element]

The display device of one embodiment of the present invention can employ various modes and include various display elements. Examples of the display elements include an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube, which are display media whose contrast, luminance, reflectance, transmittance, or the like is changed by electrical or magnetic action. Alternatively, quantum dots may be used as the display element. Examples of display devices including EL elements include an EL display. Examples of display devices including an electron emitter include a field emission display (FED), an SED-type flat panel display (SED: surface-conduction electron-emitter display), and the like. Examples of display devices containing quantum dots include a quantum dot display. Examples of display devices including a liquid crystal element include a liquid crystal display (e.g., a transmissive liquid crystal display, a transflective liquid crystal display, a reflective liquid crystal display, a direct-view liquid crystal display, or a projection liquid crystal display). Examples of display devices including electronic ink, Electronic Liquid Powder (registered trademark), or an electrophoretic element include electronic paper. The display device may be a plasma display panel (PDP).

In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. When graphene or graphite is provided in this manner, a nitride semiconductor, for example, an n-type GaN semiconductor layer including crystals or the like can be easily formed thereover. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by metal organic chemical vapor deposition (MOCVD). Note that when the graphene is provided, the GaN semiconductor layers included in the LED can also be formed by a sputtering method.

Figure 8A:
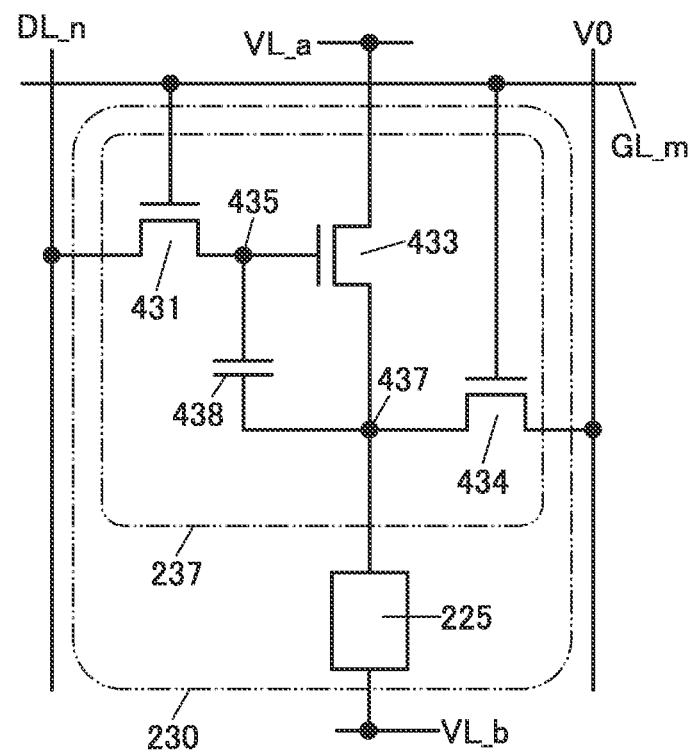
FIGS. 8A and 8B illustrate one embodiment of the present invention.
Figure 8B:
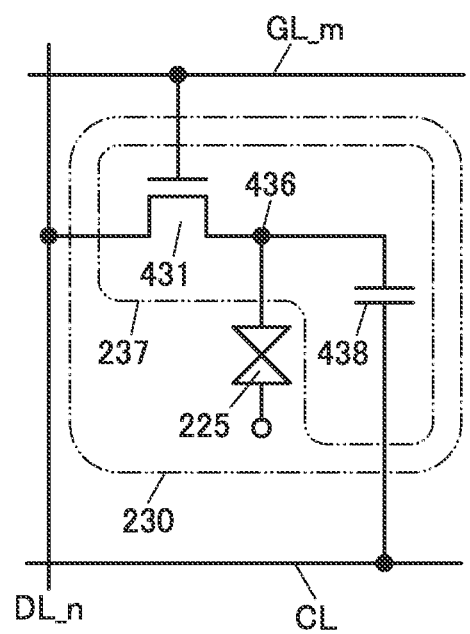

FIGS. 8A and 8B illustrate circuit configuration examples that can be used for the pixels 230.

[Example of Pixel Circuit for Light-Emitting Display Device]

The pixel circuit 237 illustrated in FIG. 8A includes a transistor 431, a capacitor 438, a transistor 433, and a transistor 434. The pixel circuit 237 is electrically connected to the display element 225. In the pixel circuit 237 illustrated in FIG. 8A, a light-emitting element is used as the display element 225.

One of a source and a drain of the transistor 431 is electrically connected to a wiring to which a data signal is supplied (hereinafter referred to as a signal line DL_n). A gate of the transistor 431 is electrically connected to a wiring to which a gate signal is supplied (hereinafter referred to as a scan line GL_m).

The transistor 431 has a function of controlling whether to write a data signal to a node 435.

One of a pair of electrodes of the capacitor 438 is electrically connected to the node 435, and the other is electrically connected to a node 437. The other of the source and the drain of the transistor 431 is electrically connected to the node 435.

The capacitor 438 functions as a storage capacitor for storing data written to the node 435.

One of a source and a drain of the transistor 433 is electrically connected to a potential supply line VL_a, and the other is electrically connected to the node 437. A gate of the transistor 433 is electrically connected to the node 435.

One of a source and a drain of the transistor 434 is electrically connected to a potential supply line V0, and the other is electrically connected to the node 437. A gate of the transistor 434 is electrically connected to the scan line GL_m.

One of an anode and a cathode of the light-emitting element (the display element 225) is electrically connected to a potential supply line VL_b, and the other is electrically connected to the node 437.

As the light-emitting element, an organic electroluminescent element (also referred to as "organic EL element") or the like can be used, for example. Note that the light-emitting element is not limited to organic EL elements; an inorganic EL element including an inorganic material can be used. Depending on a material used for the light-emitting element, the light-emitting element can emit infrared light or ultraviolet light other than visible light.

For example, a high power supply potential VDD is supplied to one of the potential supply line VL_a and the potential supply line VL_b, and a low power supply potential VSS is supplied to the other.

In the display device including the pixel circuit 237 in FIG. 8A, the pixel circuits 237 are sequentially selected row by row by, for example, the circuit 232a, whereby the transistors 431 and the transistors 434 are turned on and a data signal is written to the nodes 435.

When the transistors 431 and the transistors 434 are turned off, the pixel circuits 237 in which the data has been written to the nodes 435 are brought into a holding state. Furthermore, the amount of current flowing between the source and the drain of the transistor 433 is controlled in accordance with the potential of the data written to the node 435. The light-emitting element emits light with a luminance corresponding to the amount of current flow. This operation is sequentially performed row by row; thus, an image can be displayed.

[Example of Pixel Circuit for Liquid Crystal Display Device]

The pixel circuit 237 in FIG. 8B includes the transistor 431 and the capacitor 438. In the pixel circuit 237 illustrated in FIG. 8B, a liquid crystal element is used as the display element 225.

The potential of one of a pair of electrodes of the display element 225 (the liquid crystal element) is set in accordance with the specifications of the pixel circuit 237 as appropriate. The alignment state of the display element 225 (the liquid crystal element) depends on data written to a node 436. A common potential may be applied to one of the pair of electrodes of the display element 225 included in each of the plurality of pixel circuits 237. The potential applied to the one of the pair of electrodes of the display element 225 in the pixel circuit 237 may differ between rows.

Examples of methods for driving the display device including the liquid crystal element include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of methods for driving the display device include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various liquid crystal elements and driving methods can be used.

The display element 225 (the liquid crystal element) may be formed using a liquid crystal composition including a liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel circuit 237 in the m-th row and the n-th column, one of the source and the drain of the transistor 431 is electrically connected to the signal line DL_n, and the other is electrically connected to the node 436. The gate of the transistor 431 is electrically connected to the scan line GL_m. The transistor 431 has a function of controlling whether to write a data signal to the node 436.

One of the pair of electrodes of the capacitor 438 is electrically connected to a wiring to which a particular potential is supplied (a capacitor line CL), and the other is electrically connected to the node 436. The other of the pair of electrodes of the display element 225 (the liquid crystal element) is electrically connected to the node 436. The potential of the capacitor line CL is set in accordance with the specifications of the pixel circuit 237 as appropriate. The capacitor 438 functions as a storage capacitor for storing data written to the node 436.

For example, in the display device including the pixel circuit 237 in FIG. 8B, the pixel circuits 237 are sequentially selected row by row by, for example, the circuit 232a, whereby the transistors 431 are turned on and a data signal is written to the nodes 436.

When the transistors 431 are turned off, the pixel circuits 237 in which the data has been written to the nodes 436 are brought into a holding state. This operation is sequentially performed row by row; thus, an image can be displayed in the display region 111.

Configuration Example 2

Next, a configuration example of the display region 111 which includes both a reflective liquid crystal element and a light-emitting element as the display element 225 and can display an image both in a transmissive mode and in a reflective mode is described.

FIG. 9A is a block diagram illustrating a configuration example of the display region 111, the circuit 232a, and the circuit 233a. The display region 111 includes the plurality of pixels 230 arranged in a matrix, a plurality of wirings G1, a plurality of wirings G2, a plurality of wirings ANO, a plurality of wirings CSCOM, a plurality of wirings S1, and a plurality of wirings S2. The wirings G1, the wirings G2, the wirings ANO, and the wirings CSCOM are electrically connected to the plurality of pixels 230 arranged in a direction R and to the circuit 232a. The wirings S1 and the wirings S2 are electrically connected to the plurality of pixels 230 arranged in a direction C and to the circuit 233a.

Although FIG. 9A illustrates a configuration including one circuit 232a and one circuit 233a, the circuit 232a and the circuit 233a for driving the liquid crystal element and those for driving the light-emitting element may be provided separately.

The pixel 230 includes a reflective liquid crystal element and a light-emitting element. In the pixel 230, the liquid crystal element and the light-emitting element partly overlap with each other.

FIG. 9B1 illustrates a structure example of an electrode 311 included in the pixel 230. The electrode 311 serves as a reflective electrode of the liquid crystal element in the pixel 230. The electrode 311 includes an opening 451.

In FIG. 9B1, a light-emitting element 360 in a region overlapping with the electrode 311 is denoted by a dashed line. The light-emitting element 360 overlaps with the opening 451 included in the electrode 311. Thus, light from the light-emitting element 360 is emitted to a display surface side through the opening 451.

In FIG. 9B1, the pixels 230 adjacent in the direction R correspond to different emission colors. As illustrated in FIG. 9B1, the openings 451 are preferably provided in different positions in the electrodes 311 so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 230 (such a phenomenon is also referred to as "crosstalk"). Furthermore, since the two adjacent light-emitting elements 360 can be arranged apart from each other, a high-resolution display device is achieved even when EL layers of the light-emitting elements 360 are separately formed with a shadow mask or the like.

Alternatively, arrangement illustrated in FIG. 9B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the electrode 311 serving as a reflective electrode is too small, light emitted from the light-emitting element 360 is not efficiently extracted for display.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel emitting light of the same color, in which case crosstalk can be suppressed.

[Circuit Configuration Example]

Figure 10:
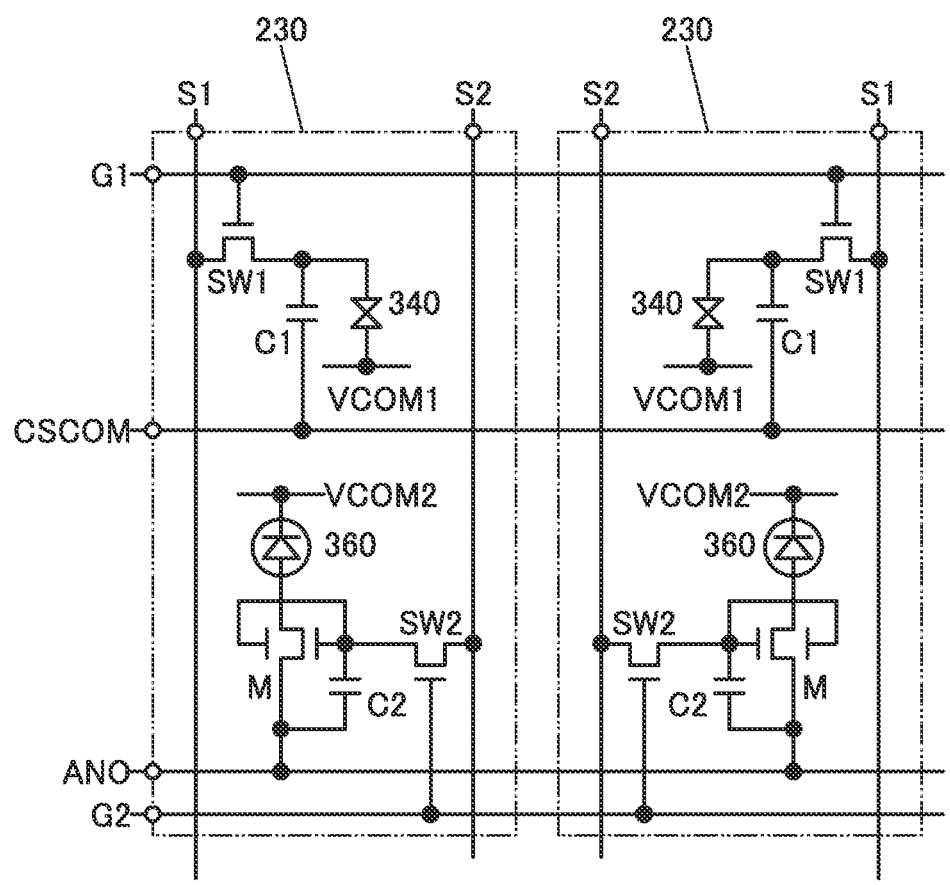
FIG. 10 illustrates one embodiment of the present invention.

FIG. 10 is a circuit diagram illustrating a configuration example of the pixel 230. FIG. 10 shows two adjacent pixels 230.

The pixel 230 includes a switch SW1, a capacitor C1, a liquid crystal element 340, a switch SW2, a transistor M, a capacitor C2, the light-emitting element 360, and the like. The pixel 230 is electrically connected to the wiring G1, the wiring G2, the wiring ANO, the wiring CSCOM, the wiring S1, and the wiring S2. FIG. 10 also illustrates a wiring VCOM1 electrically connected to the liquid crystal element 340 and a wiring VCOM2 electrically connected to the light-emitting element 360.

FIG. 10 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 10 illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of a liquid crystal of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 230 of FIG. 10, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 11A:
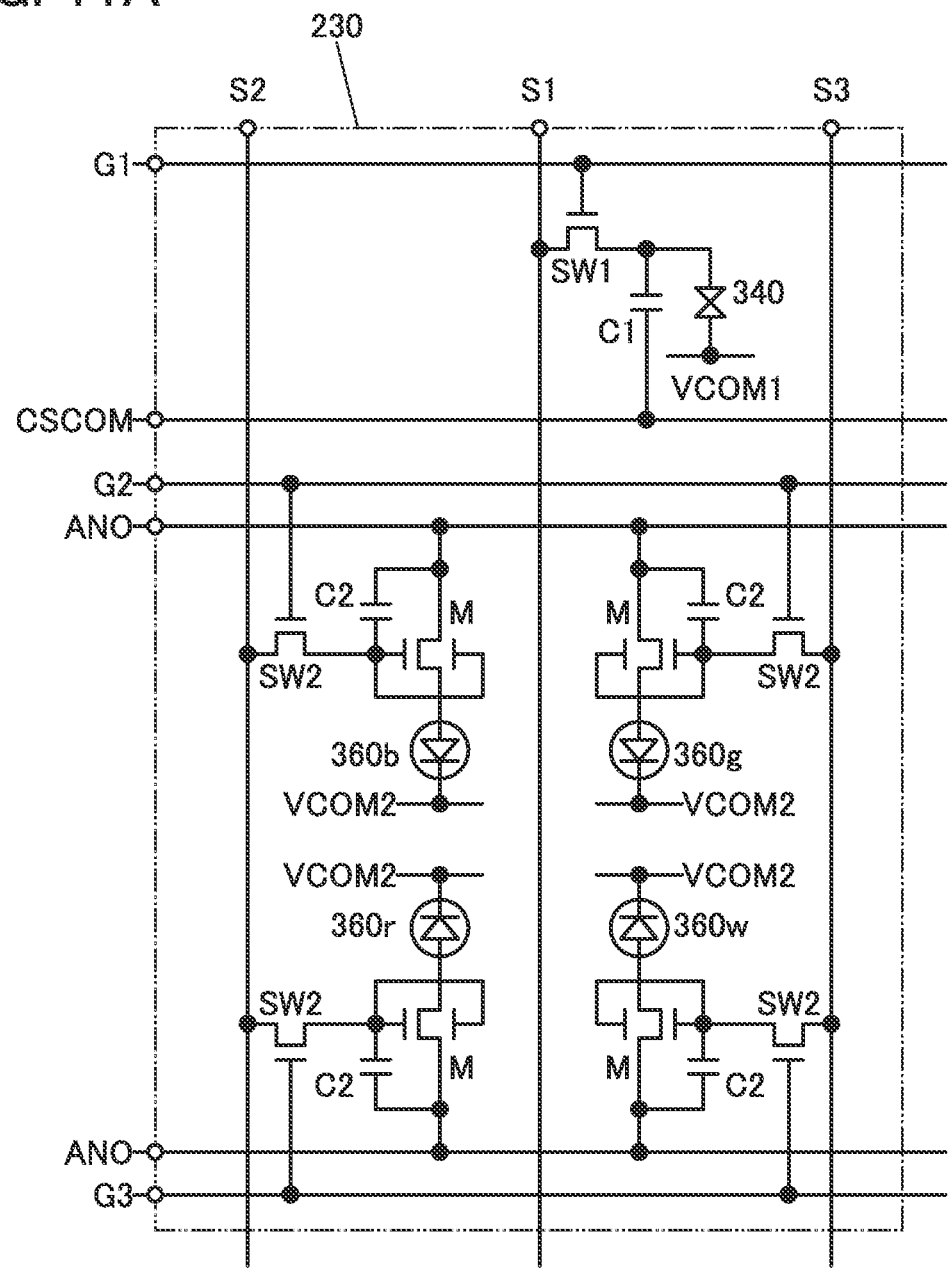
FIGS. 11A and 11B illustrate one embodiment of the present invention.

Although FIG. 10 illustrates the example in which one pixel 230 includes one liquid crystal element 340 and one light-emitting element 360, one embodiment of the present invention is not limited to this example. FIG. 11A illustrates an example in which one pixel 230 includes one liquid crystal element 340 and four light-emitting elements 360 (light-emitting elements 360r, 360g, 360b, and 360w). The pixel 230 illustrated in FIG. 11A differs from that in FIG. 10 in being capable of performing full-color display by one pixel.

In addition to the example in FIG. 10, the pixel 230 in FIG. 11A is connected to a wiring G3 and a wiring S3.

In the example illustrated in FIG. 11A, for example, light-emitting elements which exhibit red (R), green (G), blue (B), and white (W) can be used as the four light-emitting elements 360. A reflective liquid crystal element which exhibits white can be used as the liquid crystal element 340. This enables white display with high reflectance in the reflective mode. This also enables display with excellent color-rendering properties and low power consumption in the transmissive mode.

Figure 11B:
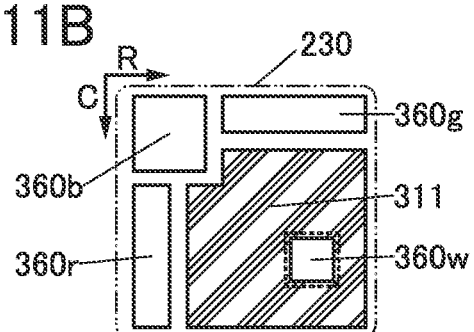

FIG. 11B illustrates a configuration example of the pixel 230. The pixel 230 includes the light-emitting element 360w which overlaps with the opening in the electrode 311 and the light-emitting elements 360r, 360g, and 360b which are located near the electrode 311. It is preferable that the light-emitting elements 360r, 360g, and 360b have substantially the same light-emitting area.

[Cross-Sectional Structural Example]

Next, a cross-sectional structural example of the display device 110 is described with reference to FIGS. 12A and 12B. Note that the display region 111 is described here; the display region 112 and the display region 113 can have the same structure.

Figure 12A:
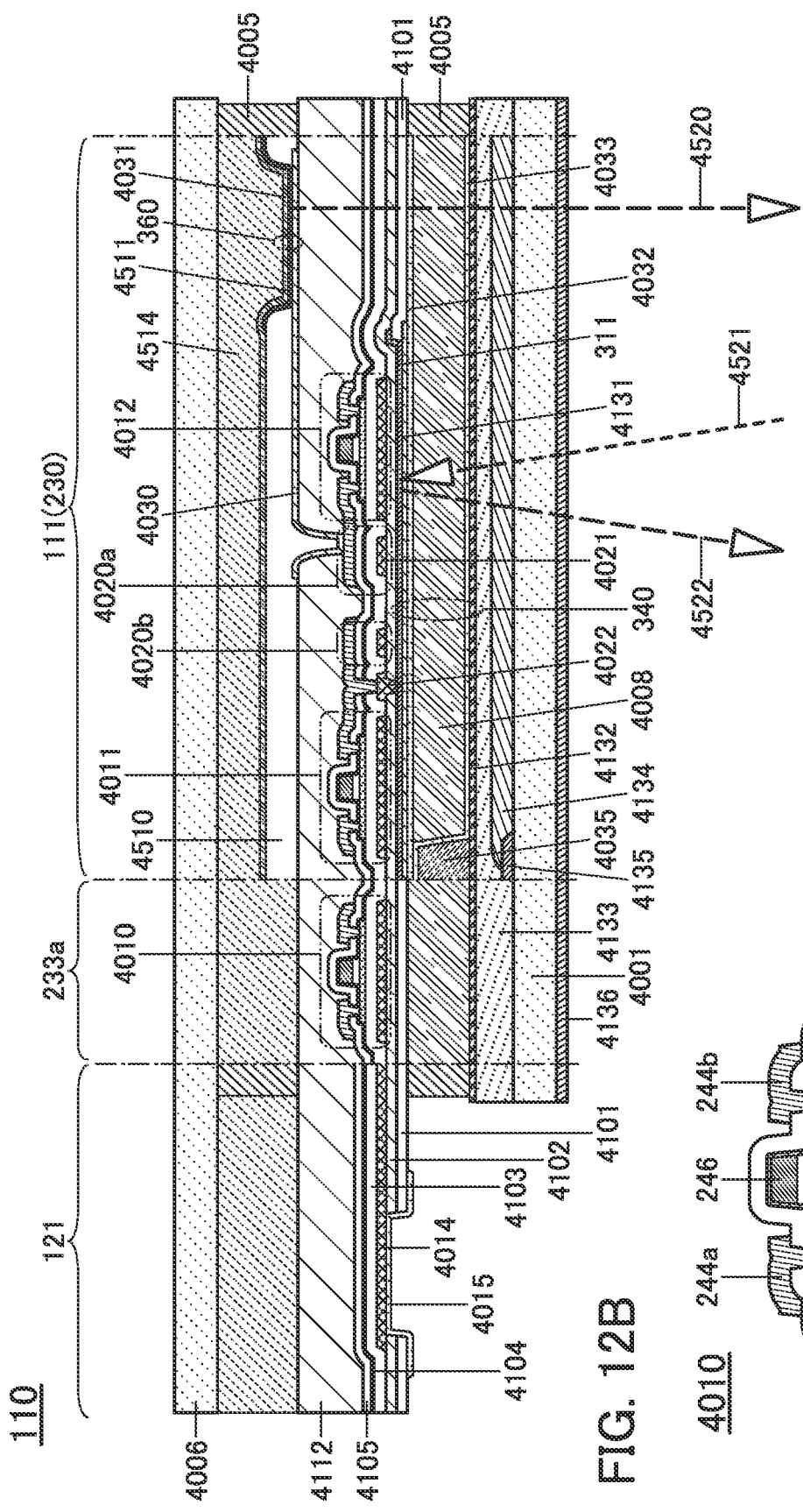
FIGS. 12A and 12B illustrate one embodiment of the present invention.

FIG. 12A illustrates the cross sections of the input terminal 121, the circuit 233a, and the display region 111. The circuit 233a includes a transistor 4010, and the display region 111 includes a transistor 4011 and a transistor 4012. The transistors 4010 to 4012 are provided over an insulating layer 4102.

Figure 12B:
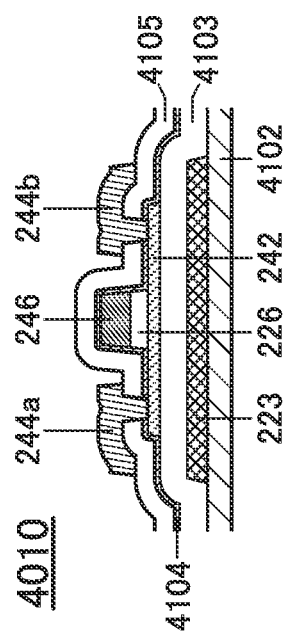

FIG. 12B is a cross-sectional view of the transistor 4010. Note that the transistors 4010 to 4012 have the same structure. The transistor 4010 includes an electrode 246, an electrode 244a, an electrode 244b, an electrode 223, a semiconductor layer 242, and an insulating layer 226. The electrode 223 is formed over the insulating layer 4102, and an insulating layer 4103 is formed over the electrode 223. The semiconductor layer 242 is formed over the insulating layer 4103. The insulating layer 226 is formed over the semiconductor layer 242. The electrode 246 is formed over the insulating layer 226.

The electrode 246, the insulating layer 226, and the semiconductor layer 242 are covered with an insulating layer 4104 and an insulating layer 4105. The electrode 244a and the electrode 244b are provided over the insulating layer 4105. The electrode 244a is electrically connected to part of the semiconductor layer 242 through an opening provided in part of the insulating layer 4104 and the insulating layer 4105. The electrode 244b is electrically connected to another part of the semiconductor layer 242 through an opening provided in another part of the insulating layer 4104 and the insulating layer 4105.

The electrode 246 and the semiconductor layer 242 include a region where they overlap with each other with the insulating layer 226 positioned therebetween. The electrode 223 and the semiconductor layer 242 include a region where they overlap with each other with the insulating layer 4103 positioned therebetween. The electrode 246 can function as a gate electrode. The electrode 223 can function as a back gate electrode. The electrode 244a can function as one of a source electrode and a drain electrode. The electrode 244b can function as the other of the source electrode and the drain electrode. The insulating layer 226 can function as a gate insulating layer. In each of the transistors 4010 to 4012 illustrated in FIGS. 12A and 12B, a channel is formed in a region of the semiconductor layer 242 which overlaps with the electrode 246. The region of the semiconductor layer 242 where the channel is formed is also referred to as "channel formation region".

Note that the electrode 246 and the electrode 223 can each function as a gate electrode. Thus, the insulating layer 226 and the insulating layer 4103 can each function as a gate insulating layer. In some cases, one of the electrodes 246 and 223 may be referred to as "gate" or "gate electrode" and the other may be referred to as "back gate" or "back gate electrode". In other cases, one of the electrodes 246 and 223 may be referred to as "first gate electrode" and the other may be referred to as "second gate electrode".

By providing the gate electrode and the back gate electrode so that the semiconductor layer is located therebetween, and by setting the potentials of the gate electrode and the back gate electrode to be the same, a region of the semiconductor layer through which carriers flow is enlarged in the film thickness direction; thus, the amount of carrier transfer is increased. As a result, the on-state current of the transistor is increased. Therefore, the transistor that has large on-state current for its area can be obtained. That is, the area occupied by the transistor can be small for required on-state current. Therefore, a semiconductor device having a high degree of integration can be provided.

Furthermore, the gate electrode and the back gate electrode are formed using conductive layers and thus each have a function of preventing an electric field generated outside the transistor from influencing the channel formation region (in particular, an electric field blocking function against static electricity and the like). When the back gate electrode is formed larger than the semiconductor layer such that the semiconductor layer is covered with the back gate electrode, the electric field blocking function can be enhanced.

Since the gate electrode and the back gate electrode each have a function of blocking an electric field from an outside, charges of charged particles and the like generated outside the electrodes do not influence the channel formation region of the semiconductor layer. Thus, degradation due to a stress test (e.g., a negative gate bias temperature (−GBT) stress test in which negative charges are applied to a gate) can be reduced. In addition, the gate electrode and the back gate electrode can block an electric field generated from the drain electrode so as not to affect the semiconductor layer. Thus, changes in the rising voltage of on-state current due to changes in drain voltage can be suppressed. Note that this effect is significant when a potential is applied to the gate electrode and the back gate electrode.

The BT stress test is one kind of accelerated test and can evaluate, in a short time, change in characteristics (a change over time) of transistors, which is caused by long-term use. In particular, the amount of change in threshold voltage of a transistor in the BT stress test is an important indicator when examining the reliability of the transistor. If the amount of change in the threshold voltage is small, the transistor has high reliability.

By providing the gate electrode and the back gate electrode and setting the potentials of the gate electrode and the back gate electrode to be the same, the amount of change in the threshold voltage is reduced. Accordingly, variation in electrical characteristics among a plurality of transistors is also reduced.

The transistor including the back gate electrode has a smaller amount of change in threshold voltage in a +GBT stress test, in which positive charges are applied to a gate, than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

Note that the electrode 223 is not necessarily provided depending on the purpose, the intended use, or the like.

The display device 110 illustrated in FIG. 12A includes a capacitor 4020a and a capacitor 4020b. The capacitor 4020a includes a region where part of the source electrode or part of the drain electrode of the transistor 4012 overlaps with an electrode 4021 with the insulating layer 4103 positioned therebetween. The electrode 4021 is formed using the same conductive layer as the electrode 223. The capacitor 4020b has the same structure as the capacitor 4020a. The transistor 4012 has a function of driving the light-emitting element 360, and the transistor 4011 has a function of driving the liquid crystal element 340.

The transistor 4012 is electrically connected to the light-emitting element 360. In this embodiment, an EL element is used as the light-emitting element 360.

An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (i.e., electrons and holes) are recombined; thus, the light-emitting organic compound is excited. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. On the other hand, the thin-film inorganic EL element has a structure where a light-emitting layer is sandwiched between dielectric layers, which is further sandwiched between electrodes, and its light emission mechanism is localized type light emission that utilizes inner-shell electron transition of metal ions. An example in which an organic EL element is used as the light-emitting element is described here.

In order to extract light emitted from the light-emitting element, at least one of the pair of electrodes is transparent. The transistor and the light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

The structure of the light-emitting element 360 is the stacked-layer structure including an electrode 4030, a light-emitting layer 4511, and an electrode 4031; however, this embodiment is not limited to this structure. The structure of the light-emitting element 360 can be changed as appropriate depending on the direction in which light is extracted from the light-emitting element 360, or the like.

A bank 4510 can be formed using an organic insulating material or an inorganic insulating material. It is particularly preferable that the bank 4510 be formed using a photosensitive resin material to have an opening over the electrode 4030 so that a side surface of the opening slopes with continuous curvature.

The light-emitting layer 4511 consists of either a single layer or a plurality of layers stacked.

A protective layer may be formed over the electrode 4031 and the bank 4510 in order to prevent entry of oxygen, hydrogen, moisture, carbon dioxide, or the like into the light-emitting element 360. For the protective layer, silicon nitride, silicon nitride oxide, aluminum oxide, aluminum nitride, aluminum oxynitride, aluminum nitride oxide, diamond-like carbon (DLC), or the like can be used. In addition, in a space that is sealed by a substrate 4006 and a sealant 4005, a filler 4514 is provided. It is preferable that, in this manner, the display device be packaged (sealed) with a protective film (such as a laminate film or an ultraviolet curable resin film) or a cover member with high air-tightness and little degasification so that the display device is not exposed to the outside air.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

When the light-emitting element has a microcavity structure, light with high color purity can be extracted. Furthermore, when a microcavity structure and a color filter are used in combination, glare can be reduced and visibility of a display image can be increased.

The electrode 4030 and the electrode 4031 (each of which is also called a "pixel electrode layer," a "common electrode layer," a "counter electrode layer," or the like) for applying voltage to the display element each have either a light-transmitting property or a light-reflecting property, which depends on the direction in which light is extracted, the position where the electrode layer is provided, the pattern structure of the electrode layer, and the like.

For example, the electrode 4030 and the electrode 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

For example, the electrode 4030 and the electrode 4031 can also be formed using one or more kinds selected from metals such as tungsten (W), molybdenum (Mo), zirconium (Zr), hafnium (Hf), vanadium (V), niobium (Nb), tantalum (Ta), palladium (Pd), chromium (Cr), cobalt (Co), nickel (Ni), titanium (Ti), platinum (Pt), aluminum (Al), copper (Cu), and silver (Ag); an alloy thereof; and a nitride thereof.

For example, a conductive composition containing a conductive high molecule (also called a "conductive polymer") can also be used for the electrode 4030 and the electrode 4031. As the conductive high molecule, a so-called t-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

When the light-emitting element 360 has a top emission structure, the electrode 4030 is formed using a conductive material having high light reflectivity. An example of such a material is a material containing Al, Ag, or the like. Stacked layers of a conductive material having high light reflectivity and a conductive material having a light-transmitting property may be used. In addition, the electrode 4031 is formed using a conductive material having a light-transmitting property.

When the light-emitting element 360 has a bottom emission structure, the electrode 4030 is formed using a conductive material having a light-transmitting property and the electrode 4031 is formed using a conductive material having high light reflectivity.

When the light-emitting element 360 has a dual emission structure, the electrodes 4030 and 4031 are each formed using a conductive material having a light-transmitting property.

In this embodiment, the light-emitting element 360 has a bottom emission structure.

The display device 110 illustrated in FIG. 12A includes, below the insulating layer 4102, the electrode 311, an insulating layer 4101, an electrode 4131, an alignment film 4032, a liquid crystal layer 4008, an alignment film 4033, a spacer 4035, an electrode 4132, an overcoat layer 4133, a coloring layer 4134, a substrate 4001, a light-blocking layer 4135, and a polarizing plate 4136.

In the display device 110 illustrated in FIG. 12A, an electrode 4015 is electrically connected to an electrode 4014 in an opening formed in the insulating layers 4101 and 4102. The electrode 4014 is formed at the same time and in the same step as an electrode 4022.

The liquid crystal element 340 includes the electrode 4131, the electrode 4132, and the liquid crystal layer 4008. The alignment films 4032 and 4033 are provided so that the liquid crystal layer 4008 is positioned therebetween. The electrodes 4131 and 4132 overlap with each other with the liquid crystal layer 4008 positioned therebetween. The electrode 4131 has a region overlapping with the electrode 311. In addition, the electrode 4131 is electrically connected to one of a source and a drain of the transistor 4011 through the electrode 4022 and the electrode 311. The electrode 311 has a function of reflecting visible light. The electrode 4022 can be formed at the same time and in the same step as the electrode 4021.

The spacer 4035 is a columnar spacer obtained by selective etching of an insulating layer and is provided in order to control a distance between the electrode 4131 and the electrode 4132 (a cell gap). A spherical spacer may alternatively be used as the spacer 4035.

The display device 110 illustrated in FIG. 12A has functions of a light-emitting display device having a bottom emission structure and a reflective liquid crystal display device. Light 4520 emitted from the light-emitting element 360 is extracted through the substrate 4001. Light 4521 entering through the substrate 4001 is reflected by the electrode 311 and extracted through the substrate 4001. When the light 4521 is transmitted through the coloring layer 4134, light in a specific wavelength range is absorbed, so that the light 4521 becomes light 4522 having a wavelength range different from that of the light 4521. However, if the wavelength range of the entering light 4521 is within the wavelength range of light transmitted through the coloring layer 4134, the wavelength range of the light 4522 is almost the same as that of the light 4521.

The light 4520 may be white light or may be light having a specific wavelength range. For example, the light 4520 may have a wavelength range of red, green, blue, or the like. When the light 4520 is transmitted through the coloring layer 4134, light in a specific wavelength range may be absorbed.

The display device 110 illustrated in FIG. 12A can be operated in three display modes. A first mode is a display mode for displaying an image as a reflective liquid crystal display device. A second mode is a display mode for displaying an image as a light-emitting display device. A third mode is a display mode in which the first mode and the second mode are adopted at the same time.

The first mode, in which a light source is not needed and power consumption is therefore very low, is effective in the case where external light illuminance is sufficiently high and external light is white light or light of a color close to white. The first mode is suitable for displaying text information of a book, a document, or the like, for example. Since reflected light is used, eye-friendly display which is less likely to strain eyes can be performed.

The second mode, in which an extremely vivid image (with high contrast and excellent color reproducibility) can be displayed regardless of external light illuminance and chromaticity, is effective in the case where external light illuminance is extremely low, such as at night or in a dark room, for example. When a bright image is displayed with low external light illuminance, a user may feel that the image is too bright. To prevent this, an image with reduced luminance is preferably displayed in the second mode. Thus, glare can be reduced, and power consumption can also be reduced. The second mode is suitable for displaying a vivid image, a smooth moving image, or the like.

The third mode is a display mode for displaying an image by utilizing both reflected light in the first mode and emitted light in the second mode. Specifically, reflected light in the first mode and emitted light in the second mode are combined to express one color. Accordingly, a more vivid image than that in the first mode can be displayed, and power consumption can be lower than that in the second mode. For example, the third mode is effective in the case where external light illuminance is relatively low or in the case where the chromaticity of external light is not white, such as under indoor illumination or in the morning or evening, for example. With the use of the combination of reflected light and emitted light, an image that makes a viewer feel like looking at a painting can be displayed.

Figure 13:
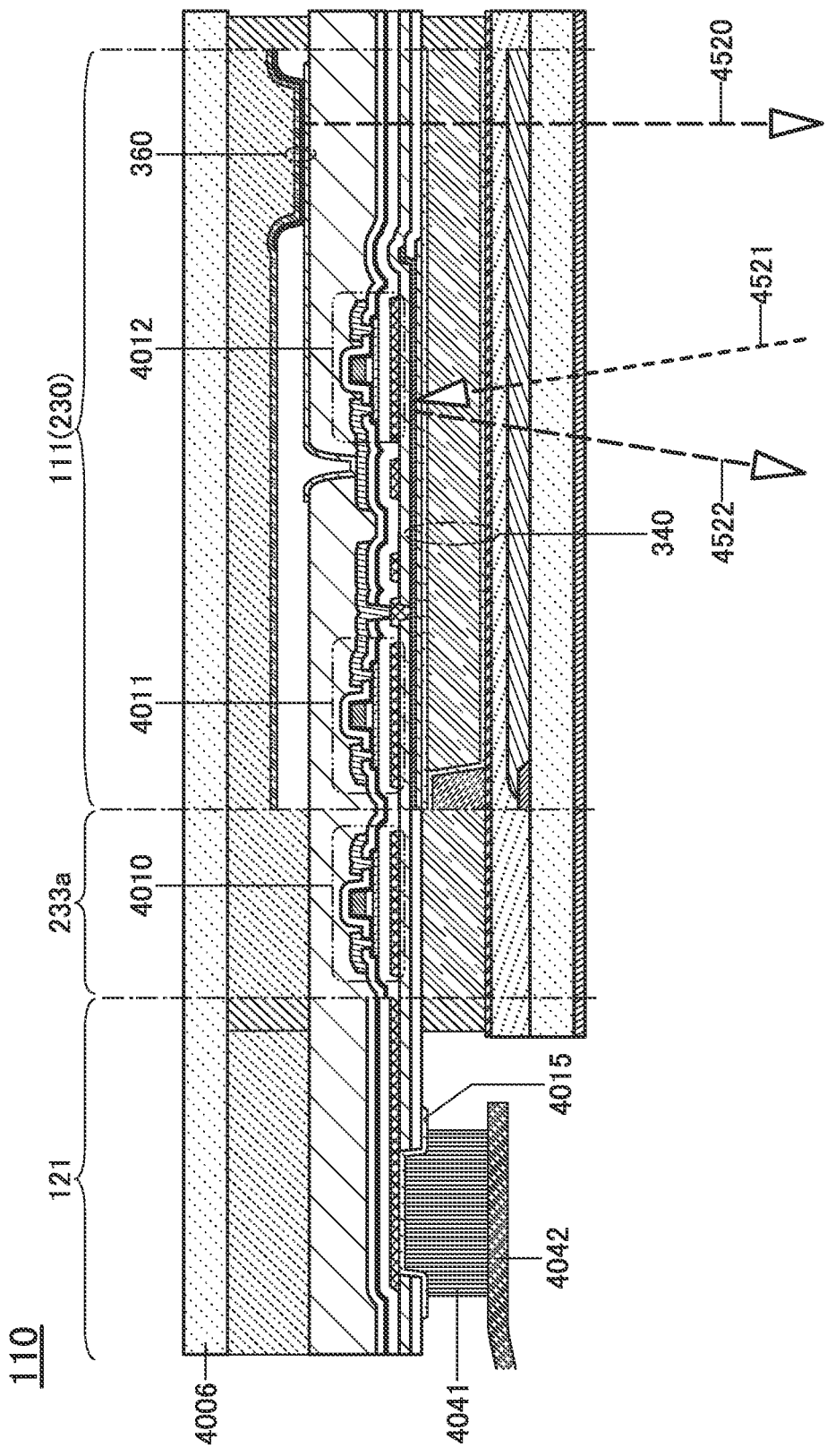
FIG. 13 illustrates one embodiment of the present invention.

The electrode 4015 may be electrically connected to a flexible printed circuit (FPC) 4042 through an anisotropic conductive layer 4041, as illustrated in FIG. 13.

Figure 14:
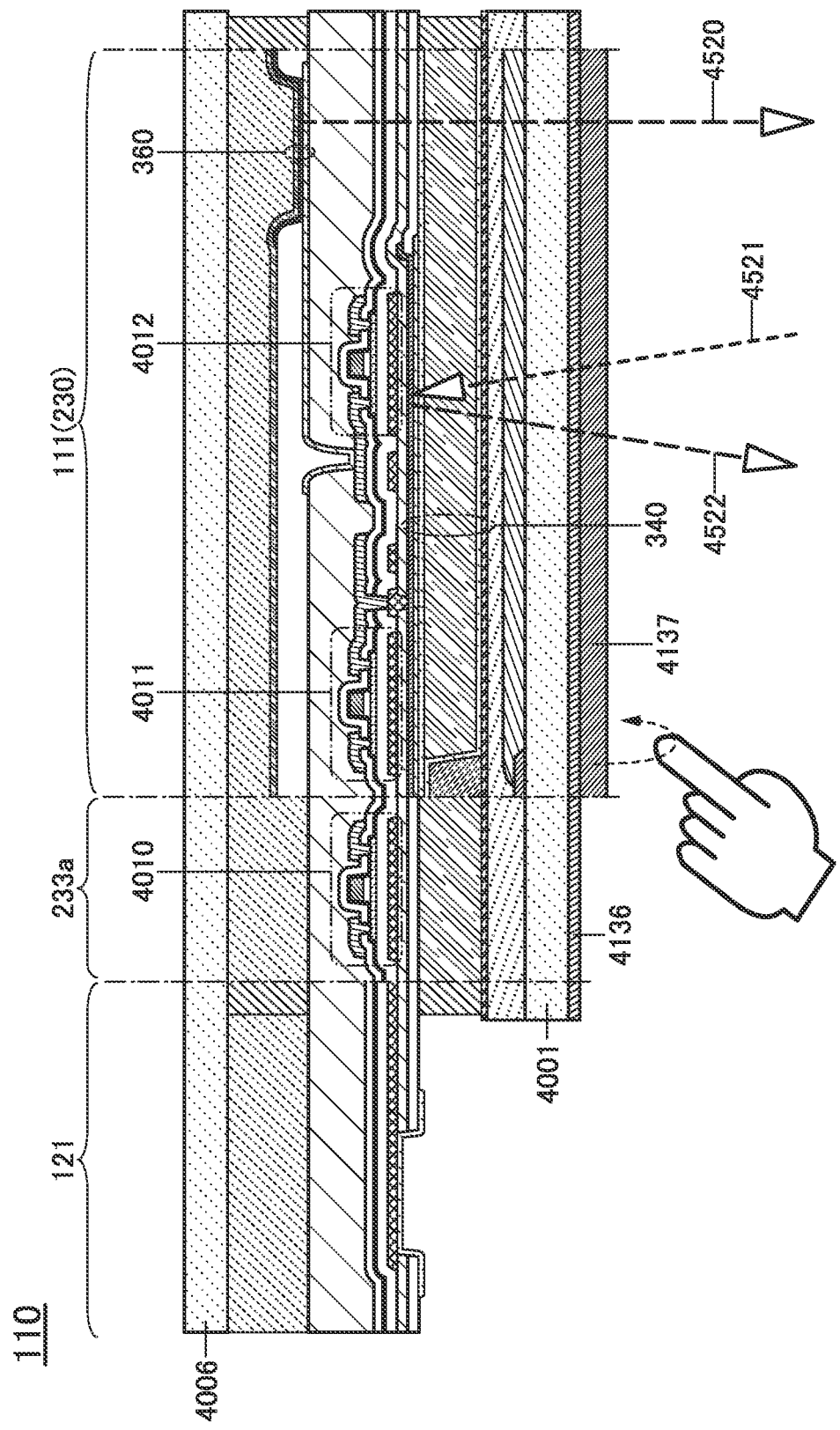
FIG. 14 illustrates one embodiment of the present invention.

A touch sensor 4137 may be provided so as to overlap with the display region of the display device 110, as illustrated in FIG. 14.

[Substrate]

There is no particular limitation on a material used for the substrate 4001 and the substrate 4006. The material is determined according to the purpose in consideration of whether it has a light-transmitting property, a heat resistance high enough to withstand heat treatment, or the like. For example, a glass substrate of barium borosilicate glass, aluminoborosilicate glass, or the like, a ceramic substrate, a quartz substrate, or a sapphire substrate can be used. Alternatively, a semiconductor substrate, a flexible substrate, an attachment film, a base film, or the like may be used as each of the substrates 4001 and 4006.

As the semiconductor substrate, a single-material semiconductor substrate of silicon, germanium, or the like or a compound semiconductor substrate of silicon carbide, silicon germanium, gallium arsenide, indium phosphide, zinc oxide, or gallium oxide, or the like is used, for example. As the semiconductor substrate, a single crystal semiconductor or a polycrystalline semiconductor may be used.

As materials of the flexible substrate, the attachment film, and the base film, the following materials can be used, for example: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyolefin, polyamide (e.g., nylon or aramid), polyimide, polycarbonate, aramid, an epoxy resin, an acrylic resin, and the like.

When such a material is used for the substrate, a lightweight display device can be provided. Furthermore, when such a material is used for the substrate, a shock-resistant display device can be provided. Moreover, when such a material is used for the substrate, a non-breakable display device can be provided.

The flexible substrate used as the substrate 4001 or 4006 preferably has a lower coefficient of linear expansion because a lower coefficient of linear expansion suppresses deformation due to an environment. The flexible substrate used as the substrate 4001 or 4006 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. In particular, aramid is preferably used for the flexible substrate because of its low coefficient of linear expansion.

[Insulating Layer]

Insulating layers such as the insulating layers 4101, 4102, 4103, 4104, 4105, and 226 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layers 4102 and 4104 be formed using an insulating material that is relatively impermeable to impurities. The insulating layers 4102 and 4104 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. The insulating layer 4102 or 4104 may be formed using indium tin zinc oxide (In—Sn—Zn oxide) having an excellent insulating property or the like.

When the insulating material that is relatively impermeable to impurities is used for the insulating layer 4102, impurity diffusion from the insulating layer 4101 side can be suppressed, and the reliability of the transistor can be improved. When the insulating material that is relatively impermeable to impurities is used for the insulating layer 4104, impurity diffusion from the insulating layer 4105 side can be suppressed, and the reliability of the transistor can be improved.

An insulating layer 4112 has a flat surface. As the insulating layer 4112, an organic material having heat resistance, such as polyimide, an acrylic-based resin, a benzocyclobutene-based resin, polyamide, or an epoxy-based resin, can be used as well as the above-mentioned insulating materials. Other than such organic materials, it is possible to use a low-dielectric constant material (a low-k material), a siloxane-based resin, PSG (phosphosilicate glass), BPSG (borophosphosilicate glass), or the like. Note that a plurality of insulating layers formed of these materials may be stacked.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. The organic group may include a fluoro group.

A surface of the insulating layer or the like may be subjected to CMP treatment. By the CMP treatment, unevenness of the sample surface can be reduced, and coverage with an insulating layer or a conductive layer formed later can be increased.

[Conductive Layer]

As a material for forming conductive layers such as the electrodes 4031, 4030, 4022, 4021, 4014, 311, 223, 244*a*, 244*b*, 4131, and 4132, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, and the like can be used. Alternatively, a semiconductor having a high electrical conductivity typified by polycrystalline silicon including an impurity element such as phosphorus may be used. Alternatively, an oxide semiconductor with high electrical conductivity or a nitride semiconductor with high electrical conductivity may be used. Alternatively, silicide such as nickel silicide may be used. A plurality of stacked conductive layers formed with these materials may be used.

The conductive material for forming conductive layers can also be a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added, or a conductive material containing nitrogen, such as titanium nitride or tantalum nitride. It is also possible to use a stacked-layer structure formed using a material containing the above metal element and the above conductive material containing oxygen. It is also possible to use a stacked-layer structure formed using a material containing the above metal element and the above conductive material containing nitrogen. It is also possible to use a stacked-layer structure formed using a material containing the above metal element, the above conductive material containing oxygen, and the above conductive material containing nitrogen.

In the display device 110 illustrated in FIG. 12A, the electrode 311 is formed using a conductive material having high light reflectivity and the electrodes 4030, 4131, and 4132 are formed using a conductive material having a light-transmitting property.

[Semiconductor Layer]

The semiconductor layer 242 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, which is one type of metal oxide, or a nitride semiconductor, an organic semiconductor, or the like can be used.

It is particularly preferable that an oxide semiconductor, which is one type of metal oxide, be used for the semiconductor layer 242. The band gap of an oxide semiconductor is 2 eV or more; thus, when the oxide semiconductor is used for the semiconductor layer 242, a transistor with an extremely low off-state current can be provided. Accordingly, an electrical signal such as an image signal can be held for a longer period, and a writing interval can be set longer in an on state. Accordingly, the frequency of refresh operations can be reduced, which leads to an effect of suppressing power consumption.

A transistor using an oxide semiconductor, which is one type of metal oxide, in the semiconductor layer where the channel is formed (also referred to as an "OS transistor") has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

In addition, the OS transistor can have relatively high field-effect mobility and is thus capable of high-speed operation. Consequently, when the OS transistor is used in a pixel portion of a display device, high-quality images can be obtained. Since a driver circuit portion and the pixel portion can be formed over one substrate with the use of the OS transistor, the number of components of the display device can be reduced.

In general, the capacitance of a capacitor provided in a display device is set in consideration of leakage current or the like of transistors provided in a pixel portion so that charge can be held for a predetermined period. The capacitance of the capacitor may be set considering off-state current of the transistor or the like.

For example, the use of an OS transistor in the pixel portion of a display device can reduce the capacitance of the capacitor and eliminate the formation of the capacitor.

[Overcoat Layer]

For the overcoat layer 4133, an organic insulating layer of an acrylic resin, an epoxy resin, polyimide, or the like can be used. With the overcoat layer 4133, diffusion of an impurity or the like contained in the coloring layer 4134 into the transistors, the display elements, or the like can be inhibited, for example. Note that the overcoat layer 4133 is not necessarily provided and a structure in which the overcoat layer 4133 is not formed may be employed.

[Coloring Layer]

Examples of materials that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

[Film Formation Method]

The insulating layers, the conductive layers for forming electrodes or wirings, the semiconductor layers, or the like can be formed by a sputtering method, a spin coating method, a chemical vapor deposition (CVD) method (such as a thermal CVD method, a metal organic chemical vapor deposition (MOCVD) method, a plasma-enhanced CVD (PECVD) method, a high-density plasma CVD method, a low-pressure CVD (LPCVD) method, or an atmospheric-pressure CVD (APCVD) method), an atomic layer deposition (ALD) method, a molecular beam epitaxy (MBE) method, a pulsed laser deposition (PLD) method, a dipping method, a spray coating method, a droplet discharge method (such as an inkjet method), or a printing method (such as screen printing or offset printing).

By using the PECVD method, a high-quality film can be formed at a relatively low temperature. By using a deposition method that does not use plasma for deposition, such as the MOCVD method, the ALD method, or the thermal CVD method, damage is not easily caused on a surface on which the film is deposited. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a deposition method without using plasma, and thus the yield of a semiconductor device can be increased. In addition, since plasma damage does not occur in the deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Note that a gas containing no chlorine is preferably used as a source gas in the case of deposition by an ALD method.

In the case where a metal oxide layer is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the metal oxide layer, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa. The deposition temperature is preferably higher than or equal to RT and lower than or equal to 500° C., further preferably higher than or equal to RT and lower than or equal to 300° C., still preferably higher than or equal to RT and lower than or equal to 200° C.

In addition, increasing the purity of a sputtering gas is necessary. For example, when a gas which is highly purified to have a dew point of −40° C. or lower, preferably −80° C. or lower, further preferably −100° C. or lower, still further preferably −120° C. or lower, is used as a sputtering gas, i.e., the oxygen gas or the argon gas, entry of moisture or the like into the metal oxide layer can be minimized.

In the case where the insulating layers, the conductive layers, the semiconductor layers, or the like are formed by a sputtering method using a sputtering gas containing oxygen, oxygen can be supplied to a layer to be formed. As the amount of oxygen contained in the sputtering gas increases, the amount of oxygen supplied to the layer to be formed tends to increase.

Modification Example 1

Figure 15:
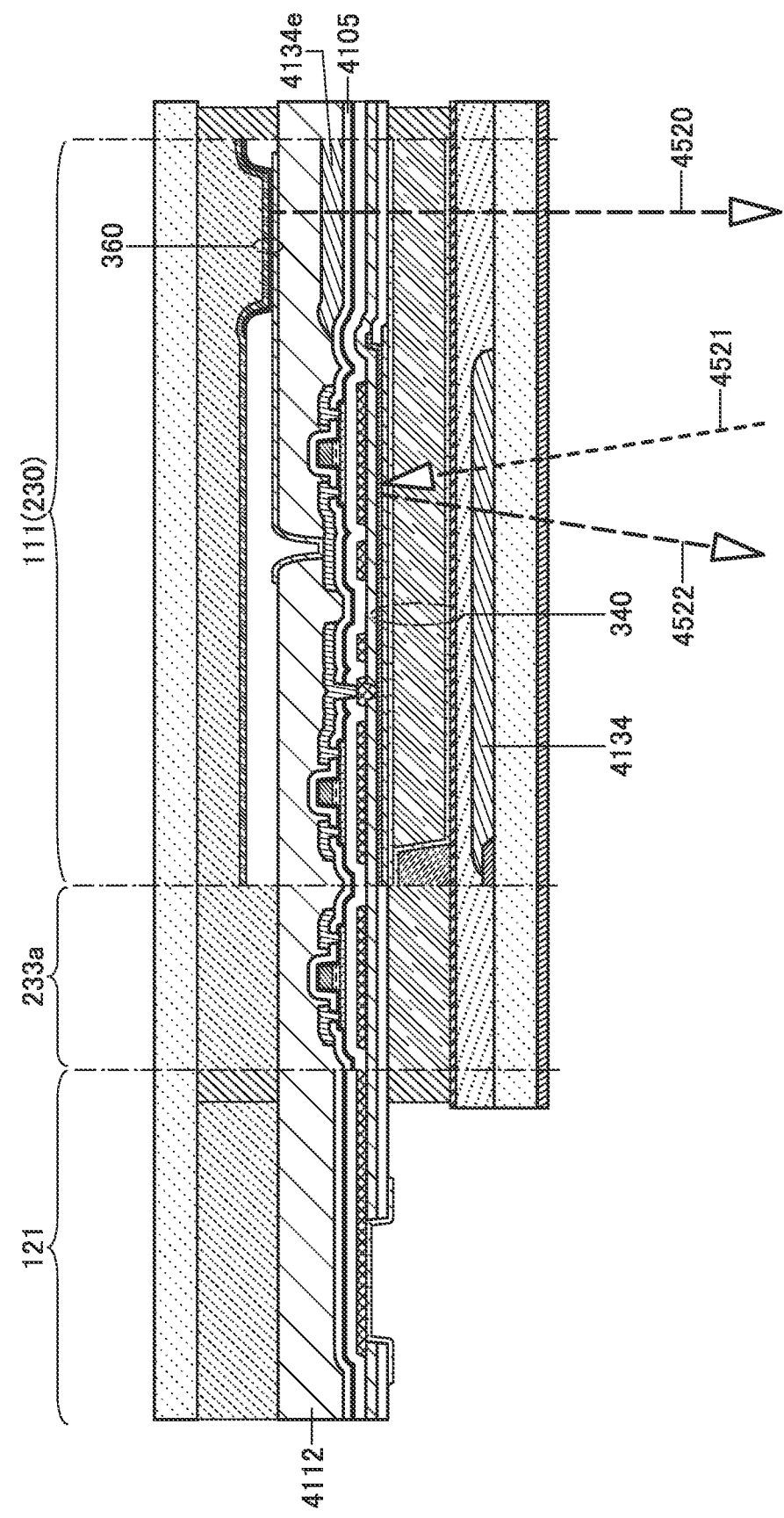
FIG. 15 illustrates one embodiment of the present invention.

FIG. 15 is a cross-sectional view of a display device 110*a* illustrated as a modification example of the display device 110. Note that differences from the display device 110 are mainly described to avoid repeated description.

The display device 110*a* includes a coloring layer 4134*e* in a region overlapping with the light-emitting element 360. Although the coloring layer 4134*e* in FIG. 15 is provided between the insulating layer 4105 and the insulating layer 4112, the coloring layer 4134*e* may be provided over any layer. A plurality of coloring layers 4134*e* may be stacked.

In the display device 110*a*, the coloring layer 4134 is not provided in the region overlapping with the light-emitting element 360.

In the display device 110 illustrated in FIG. 12A, the light 4520 emitted from the light-emitting element 360 passes through the coloring layer 4134 only once. The light 4521 entering the liquid crystal element 340 after passing through the coloring layer 4134 is reflected by the electrode 311 and passes through the coloring layer 4134 again. That is, the light 4520 emitted from the light-emitting element 360 and the light 4521 reflected in the liquid crystal element 340 pass through the coloring layer different numbers of times. Therefore, it is difficult to improve display quality both in the transmissive mode and the reflective mode.

In the display device 110*a*, the coloring layer 4134*e* functions as a coloring layer for the light-emitting element 360, and the coloring layer 4134 functions as a coloring layer for the liquid crystal element 340.

Thus, the coloring layer 4134*e* can be designed as an optimum coloring layer for the light-emitting element 360. Therefore, color reproducibility in the transmissive mode can be improved. Similarly, the coloring layer 4134 can be designed as an optimum coloring layer for the liquid crystal element 340. Therefore, color reproducibility in the reflective mode can be improved. The coloring layer 4134 and the coloring layer 4134*e* can improve the display quality of the display device.

Note that in the region overlapping with the light-emitting element 360, the coloring layer 4134 may be provided so as to overlap with the coloring layer 4134*e*.

Figure 16:
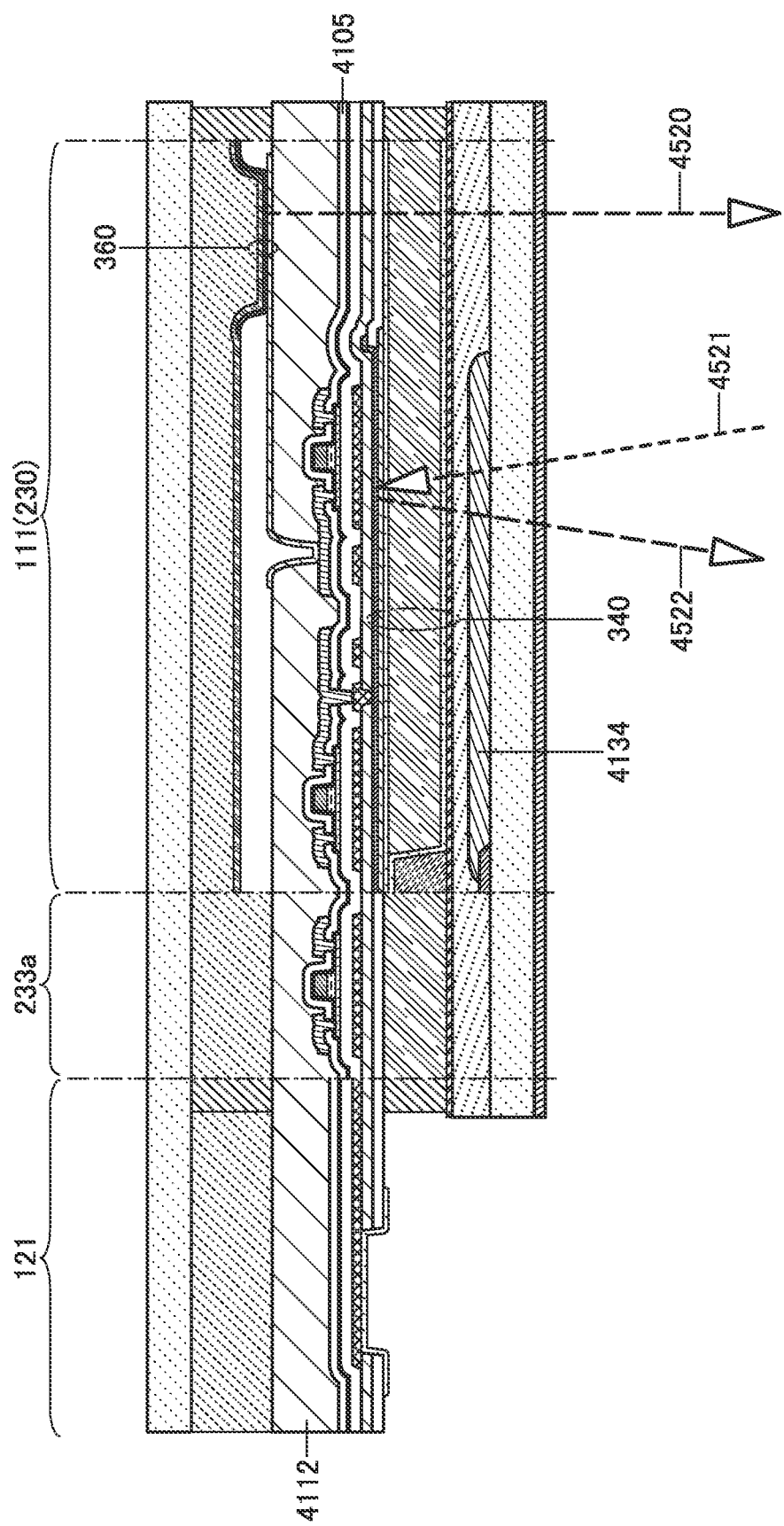
FIG. 16 illustrates one embodiment of the present invention.

As illustrated in FIG. 16, the coloring layer 4134 is not necessarily provided in the region overlapping with the light-emitting element 360. For example, the coloring layer 4134 can be omitted by using the light-emitting element 360 that emits red light, the light-emitting element 360 that emits green light, the light-emitting element 360 that emits blue light, or the like.

Modification Example 2

Figure 17:
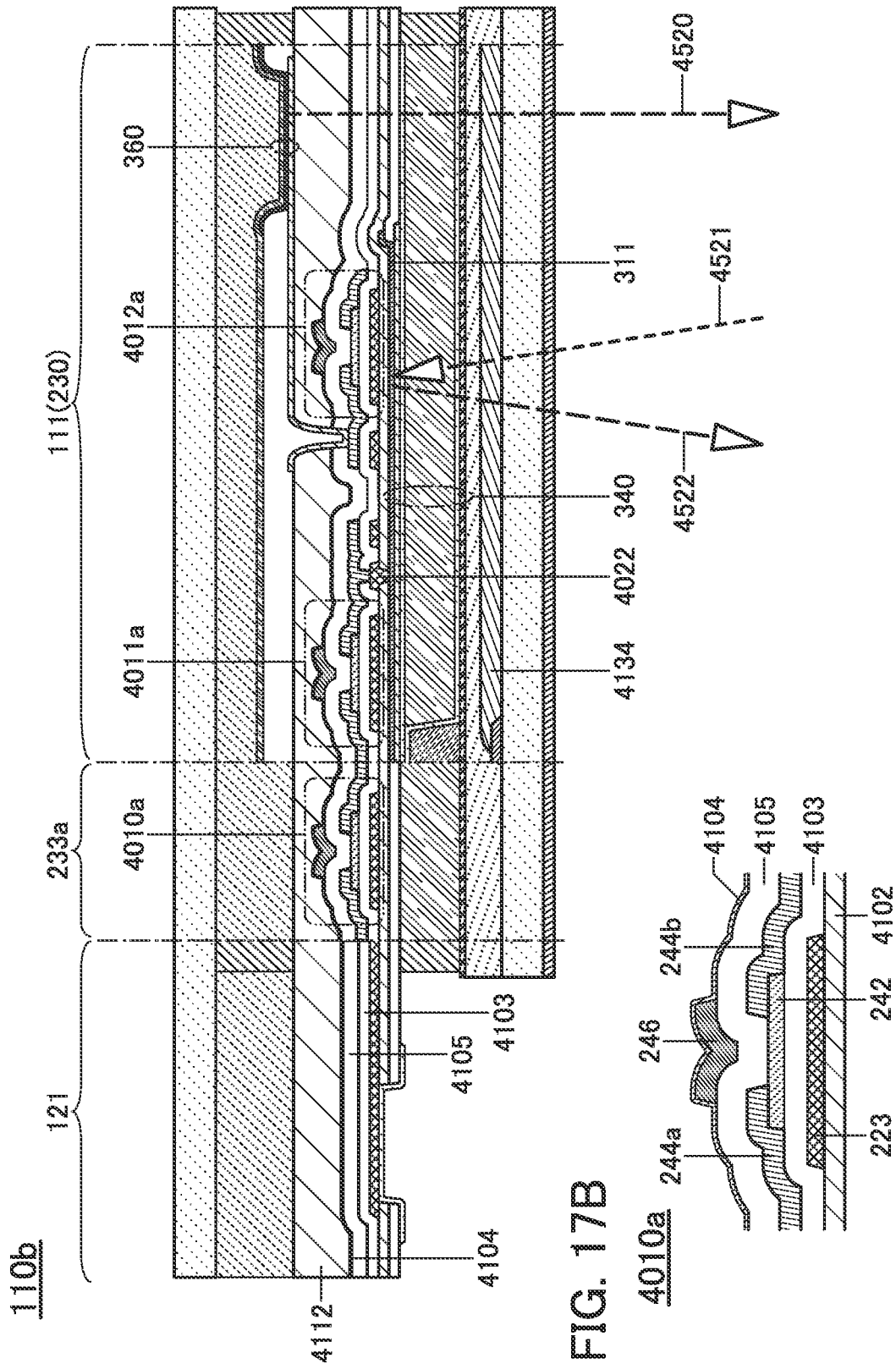
FIGS. 17A and 17B illustrate one embodiment of the present invention.

FIG. 17A is a cross-sectional view of a display device 110b illustrated as a modification example of the display device 110. Note that differences from the display device 110 are mainly described to avoid repeated description.

FIGS. 12A and 12B illustrate the case where a top-gate transistor is used in the display device. However, there is no particular limitation on the structure of the transistor used in the display device of one embodiment of the present invention. For example, a planar transistor, a staggered transistor, or an inverted staggered transistor may be used. A top-gate transistor or a bottom-gate transistor may be used. A combination of transistors having different structures may be used.

The display device 110 illustrated in FIG. 12A includes the transistors 4010, 4011, and 4012 which have a top-gate structure. The display device 110b illustrated in FIG. 17A includes transistors 4010a, 4011a, and 4012a which have a bottom-gate structure, instead of the transistors 4010, 4011, and 4012 which have a top-gate structure.

FIG. 17B is a cross-sectional view of the transistor 4010a. Note that the transistors 4010a to 4012a have the same structure. The transistor 4010a includes the electrode 246, the electrode 244a, the electrode 244b, the electrode 223, and the semiconductor layer 242. The electrode 223 is formed over the insulating layer 4102, and the insulating layer 4103 is formed over the electrode 223. The semiconductor layer 242 is formed over the insulating layer 4103. The electrode 244a and the electrode 244b are formed over the semiconductor layer 242 and the insulating layer 4103. A region of the electrode 244a is in contact with a portion of the semiconductor layer 242. A region of the electrode 244b is in contact with another portion of the semiconductor layer 242. The insulating layer 4105 is formed over the semiconductor layer 242, the electrode 244a, and the electrode 244b. The electrode 246 is formed over the insulating layer 4105. The insulating layer 4104 is formed over the insulating layer 4105 and the electrode 246.

The electrode 223 and the semiconductor layer 242 include a region where they overlap with each other with the insulating layer 4103 positioned therebetween. The electrode 246 and the semiconductor layer 242 include a region where they overlap with each other with the insulating layer 4105 positioned therebetween. As described above, the electrode 246 and the electrode 223 can each function as a gate electrode. Thus, the insulating layer 4103 and the insulating layer 4105 can each function as a gate insulating layer.

In each of the transistors 4010a to 4012a which have a bottom-gate structure and are illustrated in FIGS. 17A and 17B, a region in the semiconductor layer 242 which overlaps with the electrode 223 and is provided between the electrode 244a and the electrode 244b when seen in a plan view functions as a channel formation region.

The electrode 246 may be provided over the insulating layer 4104. Note that the electrode 246 is not necessarily provided depending on the purpose, the intended use, or the like.

This embodiment can be implemented in appropriate combinations with any of the other embodiments.

Embodiment 3

Figure 18:
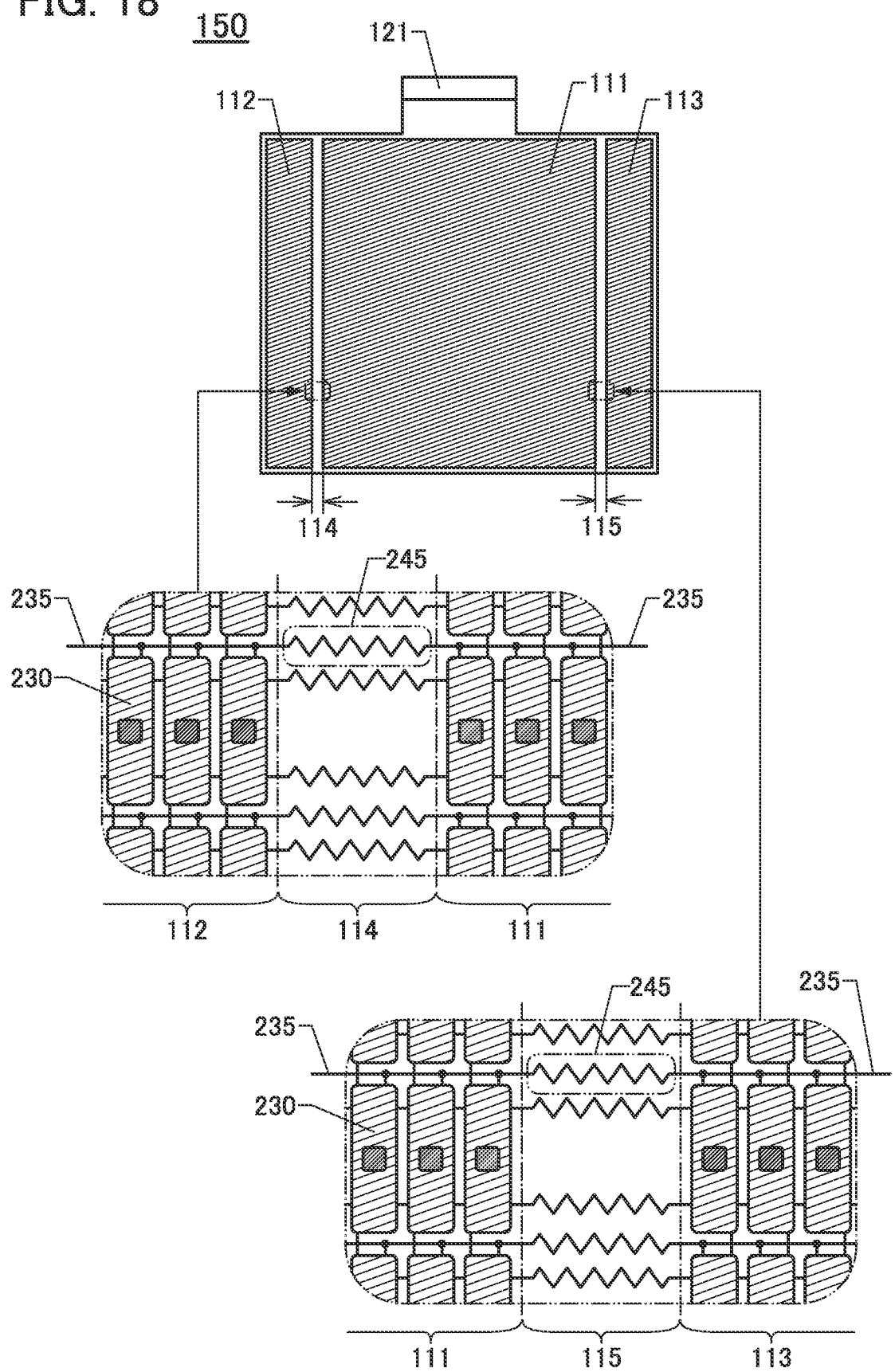
FIG. 18 illustrates one embodiment of the present invention.
Figure 19:
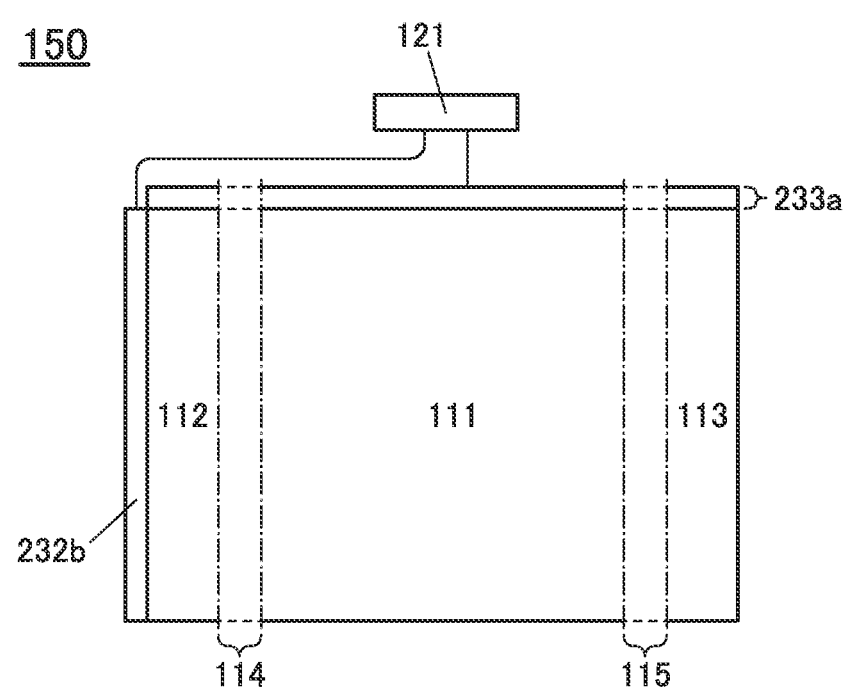
FIG. 19 illustrates one embodiment of the present invention.

In this embodiment, a modification example of the display device 110 will be described with reference to drawings. Like the display device 110, a display device 150 includes a display region 111, a display region 112, a display region 113, a bend region 114, and a bend region 115. Note that differences from the display device 110 are mainly described in this embodiment to avoid repeated description. FIG. 18 is a plan view of the display device 150, which is a modification example of the display device 110. FIG. 19 is a block diagram illustrating a configuration example of the display device 150.

The display device 150 differs from the display device 110 in not including the input terminal 122 and the input terminal 123. In the display device 150, the bend region 114 and the bend region 115 each include a wiring 245 which has a meandering shape. The wiring 245 provided in the bend region 114 electrically connects the display region 111 and the display region 112. For example, the wiring 235 in the display region 111 and the wiring 235 in the display region 112 are electrically connected to each other through the wiring 245. The wiring 245 provided in the bend region 115 electrically connects the display region 111 and the display region 113. For example, the wiring 235 in the display region 111 and the wiring 235 in the display region 113 are electrically connected to each other through the wiring 245.

The display region 111, the display region 112, and the display region 113 can function as one display region because the display region 111, the display region 112, and the display region 113 are electrically connected through the wirings 245. Therefore, among the circuits 232a, 232b, and 232c, only the circuit 232b, for example, can be used to drive the display region 111, the display region 112, and the display region 113. In addition, among the circuits 233a, 233b, and 233c, only the circuit 233a, for example, can be used to drive the display region 111, the display region 112, and the display region 113.

Such electrical connection between the display region 111 and the display region 112 and between the display region 111 and the display region 113 with the use of the wirings 245 leads to a simplified configuration of the driver circuit portion, a decrease in the area occupied by the driver circuit portion, and a decrease in the number of input terminals. For example, unlike in the display device 110, the input terminal 122 and the input terminal 123 are eliminated in the display device 150.

Figure 20:
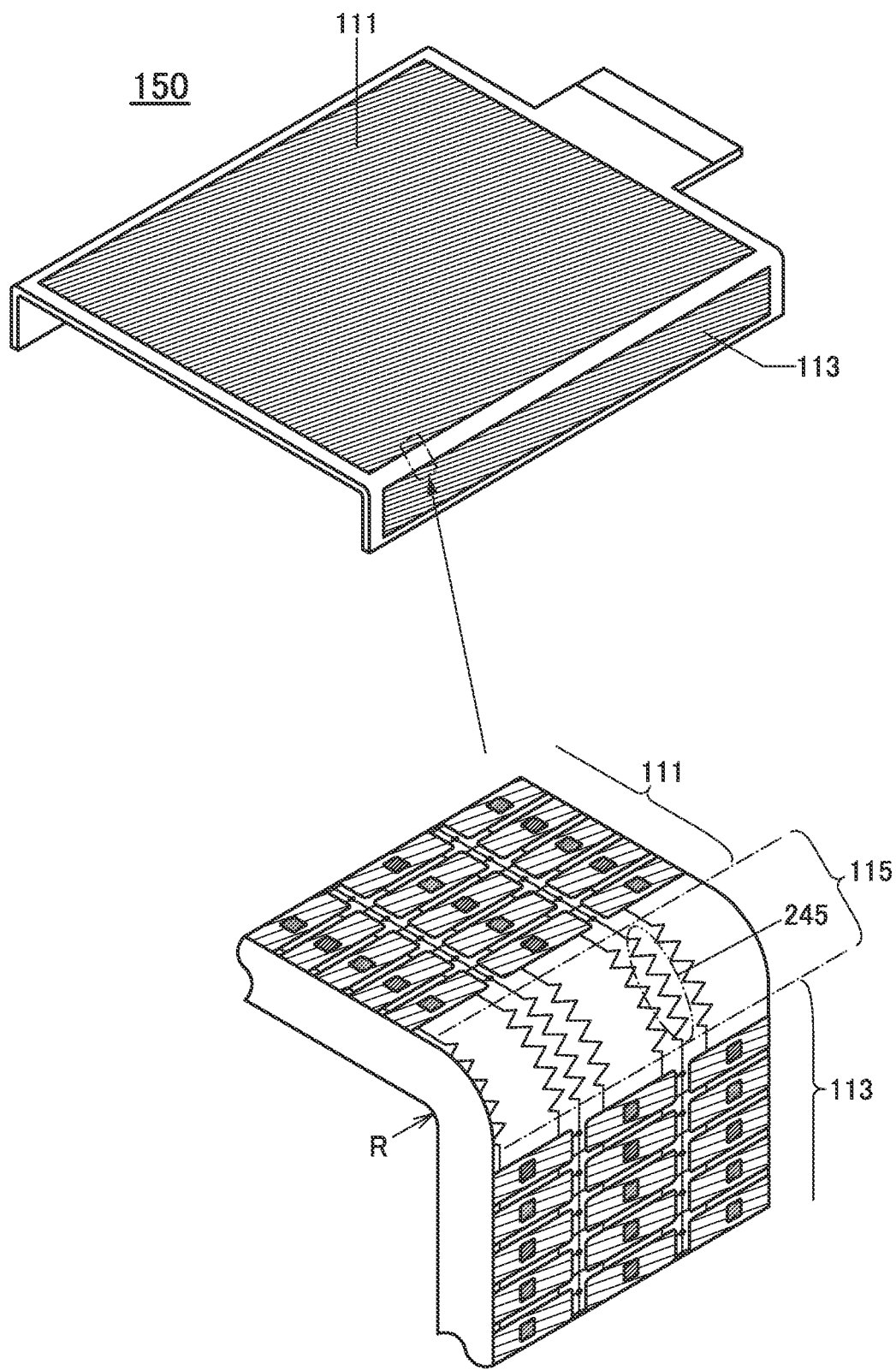
FIG. 20 illustrates one embodiment of the present invention.

FIG. 20 illustrates a perspective view of the display device 150 which is bent in the bend region 114 and the bend region 115. Since the wirings 245 provided in the bend region 114 and the bend region 115 have a meandering shape, a disconnection or the like due to bending does not occur easily. Therefore, defective operation, lowered reliability, or the like due to a short-circuit, a disconnection, or the like can be prevented. In addition, even when the curvature radius R of the bend portion is decreased, defective operation, lowered reliability, or the like of the display device 150 due to a short-circuit or a disconnection of a wiring or an electrode or the like does not occur easily. Specifically, the curvature radius R can be less than or equal to 1 mm. Alternatively, the curvature radius R can be less than or equal to 0.5 mm. Alternatively, the curvature radius R can be less than or equal to 0.1 mm.

Figure 21A:
FIGS. 21A to 21G each illustrate one embodiment of the present invention.
Figure 21B:
Figure 21C:
Figure 21D:
Figure 21E:
Figure 21F:
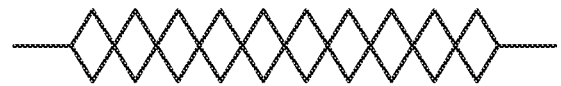
Figure 21G:

Note that the wiring 245 can have a variety of shapes. For example, the wiring 245 may meander like a triangular wave (see FIG. 21A). The wiring 245 may meander like a sine wave (see FIG. 21B). The wiring 245 may meander like an arc (see FIG. 21C). The wiring 245 may have a meandering shape formed by a combination of straight lines (see FIG. 21D). The wiring 245 may have a meandering shape formed by a combination of straight lines and curves (see FIG. 21E). The wiring 245 may have a chain-like shape as illustrated in FIG. 21F or 21G.

This embodiment can be implemented in appropriate combinations with any of the other embodiments.

Embodiment 4

In this embodiment, a display device 110a which is a modification example of the display device 110, a display device 150a which is a modification example of the display device 150, and a display device 150b which is a modification example of the display device 150a are described with reference to drawings.

[Display Device 110a and Display Device 150a]

Figure 22:
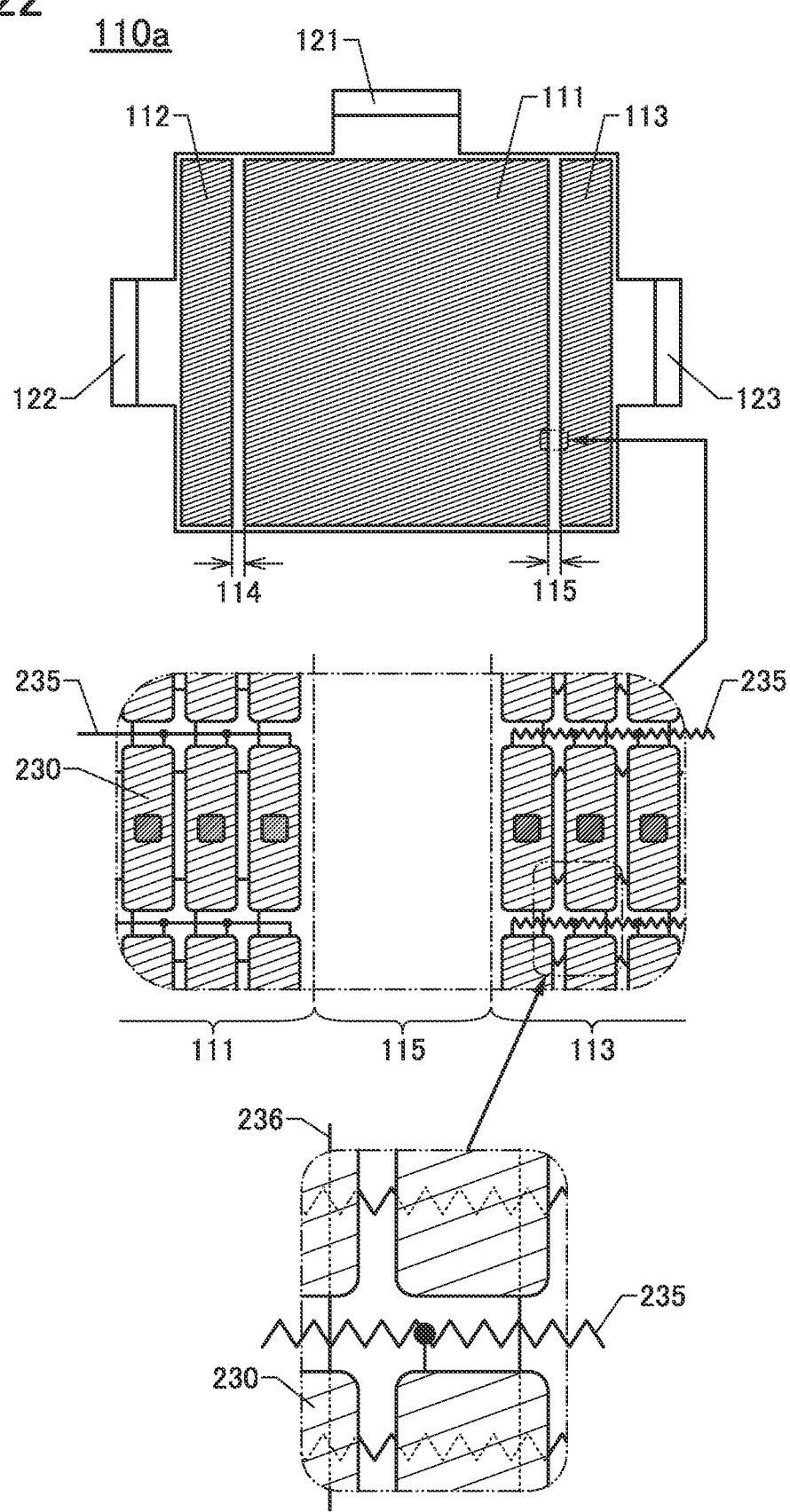
FIG. 22 illustrates one embodiment of the present invention.
Figure 23:
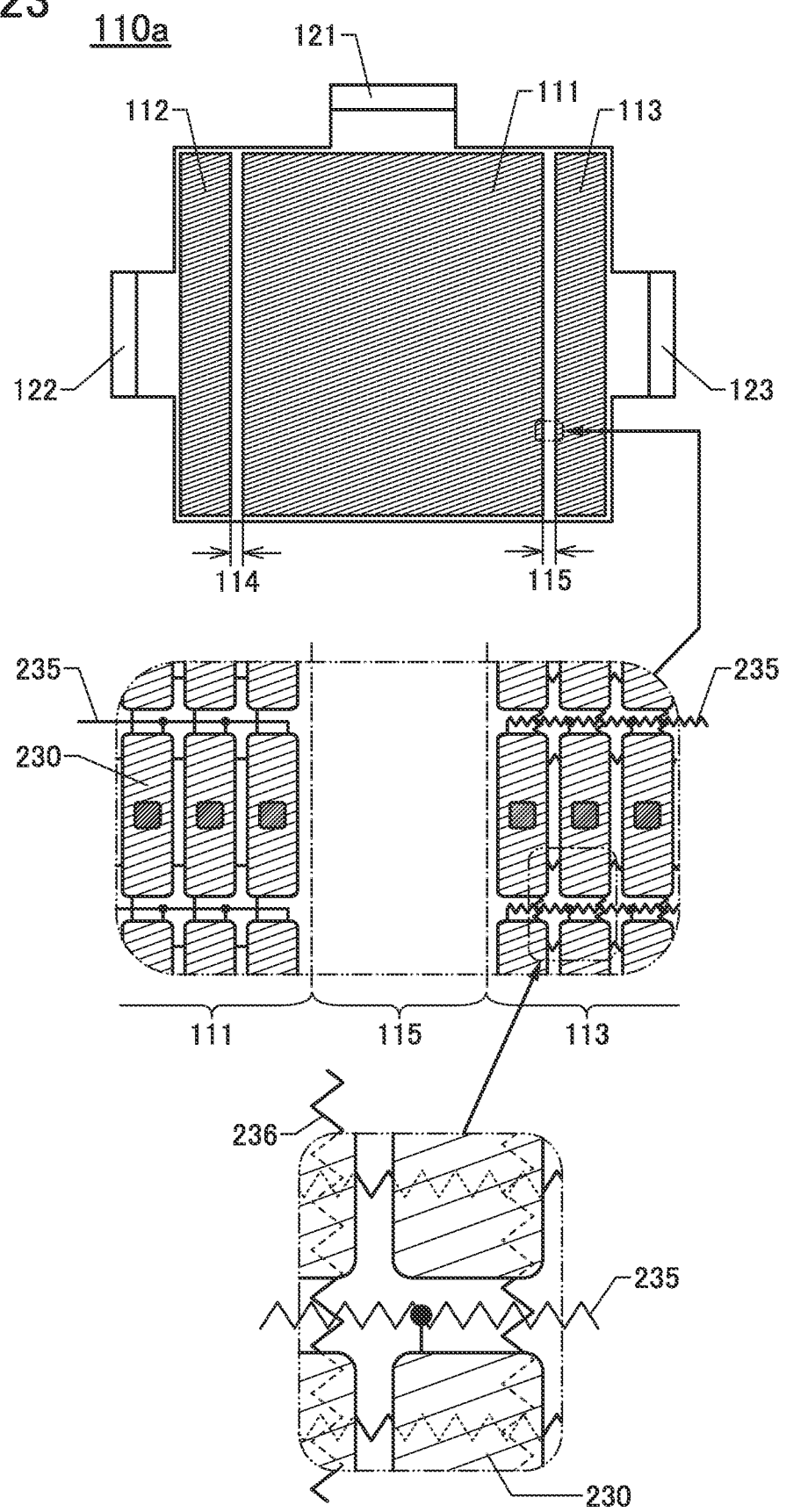
FIG. 23 illustrates one embodiment of the present invention.
Figure 24:
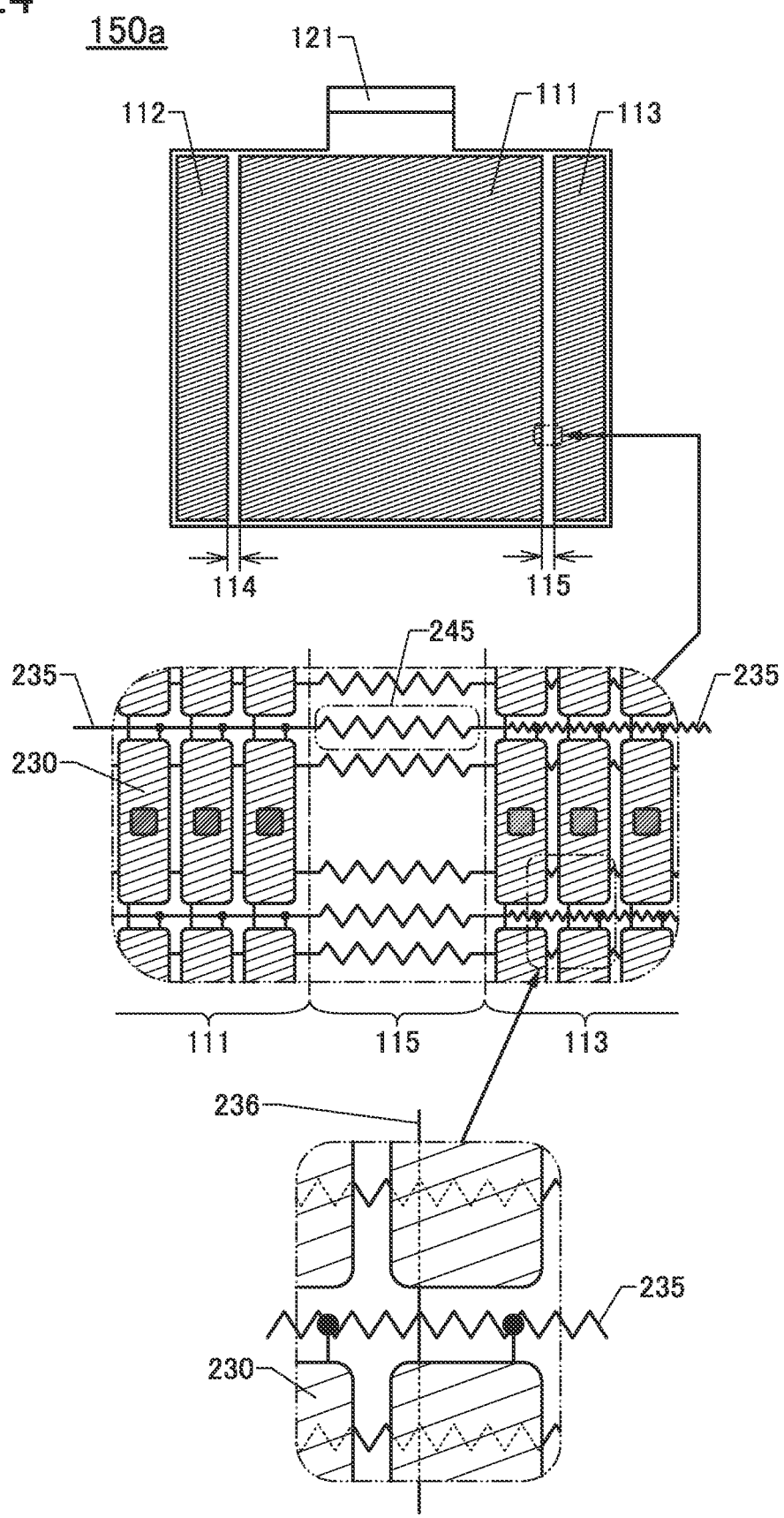
FIG. 24 illustrates one embodiment of the present invention.

First, the display device 110a and the display device 150a are described. FIG. 22 and FIG. 23 are plan views of the display device 110a which is a modification example of the display device 110. FIG. 24 illustrates a plan view of the display device 150a which is a modification example of the display device 150. Like the display device 110 and the display device 150, the display device 110a and the display device 150a each include a display region 111, a display region 112, a display region 113, a bend region 114, and a bend region 115. Note that differences from the display device 110 and/or the display device 150 are mainly described to avoid repeated description.

In each of the display devices 110a and 150a, the display region 113 includes a wiring 235 which has a meandering shape. Like the display region 113, the display region 112 also includes a wiring 235 which has a meandering shape (not illustrated). Since the wiring 235 in each of the display regions 112 and 113 has a meandering shape or a chain-like shape like the wiring 245, a disconnection of the wiring 235 or the like does not occur easily even when the display region 112 and the display region 113 are curved or bent. Therefore, defective operation, lowered reliability, or the like due to a short-circuit, a disconnection, or the like can be prevented.

In addition to the wiring 235, another wiring may have a meandering shape or a chain-like shape. For example, a wiring 236 may have a meandering shape as in the display device 110a illustrated in FIG. 23.

Figure 26A:
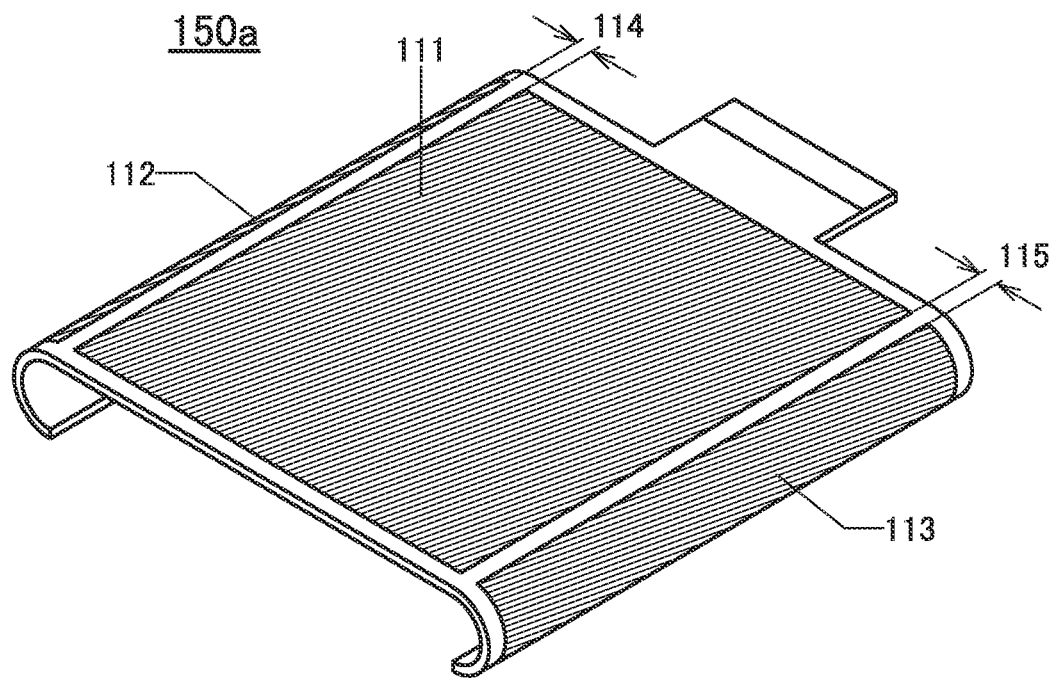
FIGS. 26A and 26B illustrate one embodiment of the present invention.

FIG. 26A is a perspective view of the display device 150a which is curved in the display region 112 and the display region 113. Note that the display device 110a can have a shape similar to that in FIG. 26A.

[Display Device 150b]

Figure 25:
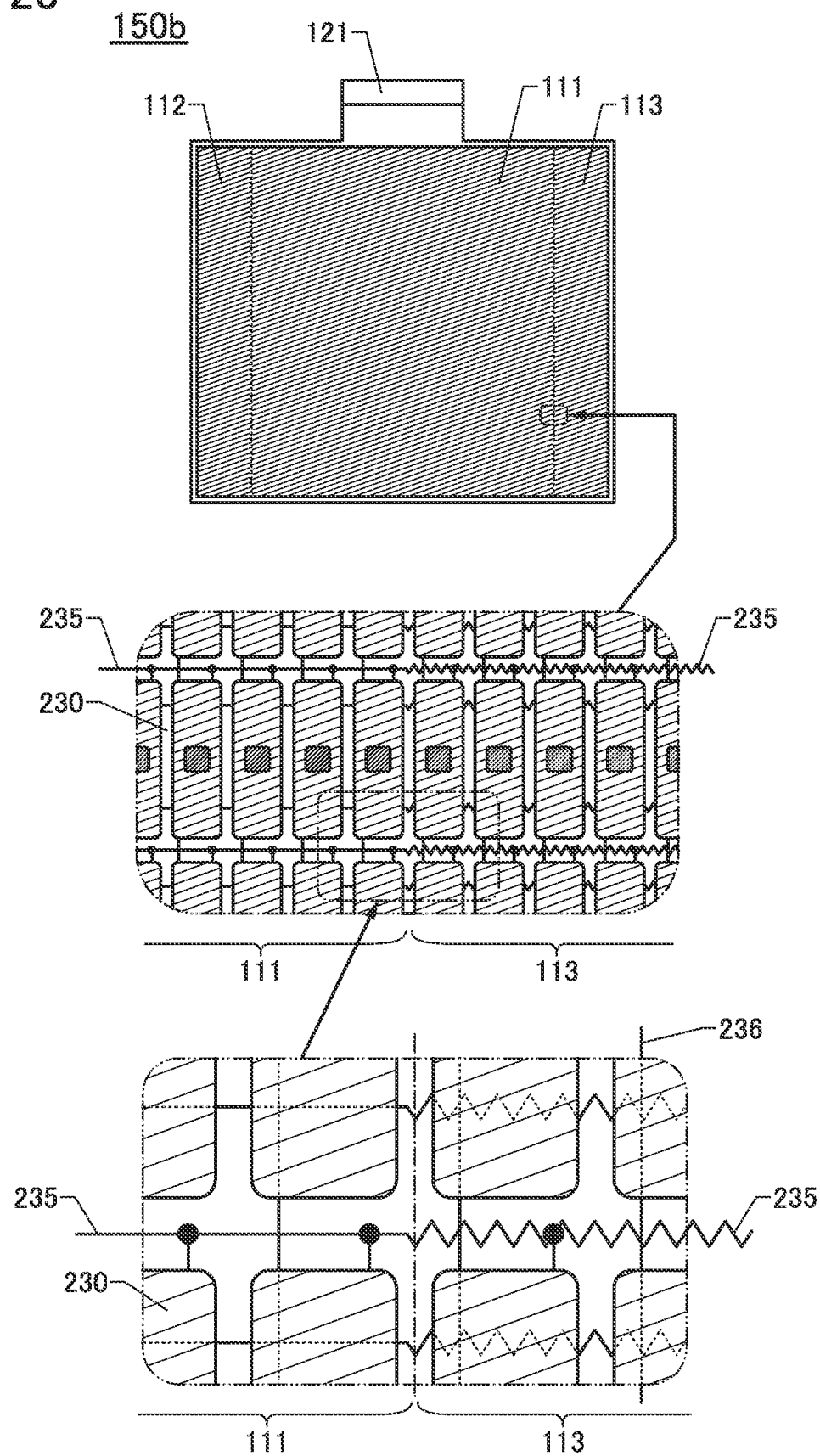
FIG. 25 illustrates one embodiment of the present invention.

Next, the display device 150b is described. FIG. 25 illustrates a plan view of the display device 150b which is a modification example of the display device 150a. Note that differences from the display device 150a are mainly described to avoid repeated description.

The display device 150b differs from the display device 150a in not including the bend region 114 and the bend region 115. Accordingly, the display device 150b does not include the wiring 245. In other words, in the display device 150b, the wiring 235 in the display region 111 and the wiring 235 in the display region 112 are connected to each other without the wiring 245. In addition, in the display device 150b, the wiring 235 in the display region 111 and the wiring 235 in the display region 113 are connected to each other without the wiring 245.

Since the display device 150b does not include the bend region 114 and the bend region 115, the display region 111, the display region 112, and the display region 113 are visually recognized as one continuous display region. Therefore, the display regions 111 to 113 can display a seamless image.

Figure 26B:
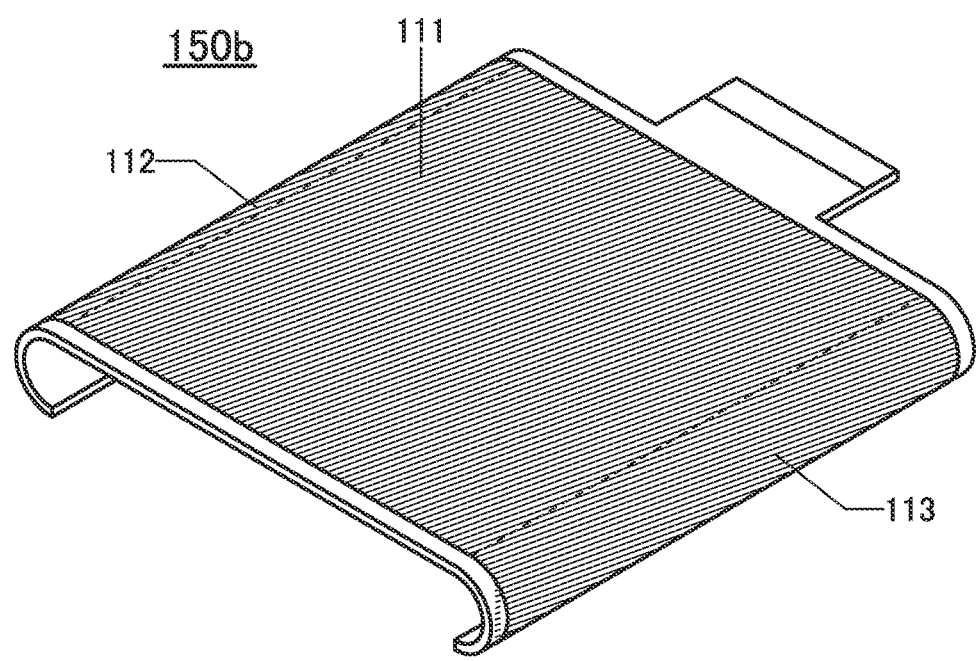

FIG. 26B is a perspective view of the display device 150b which is curved in the display region 112 and the display region 113.

[Display Device 150c]

Figure 27:
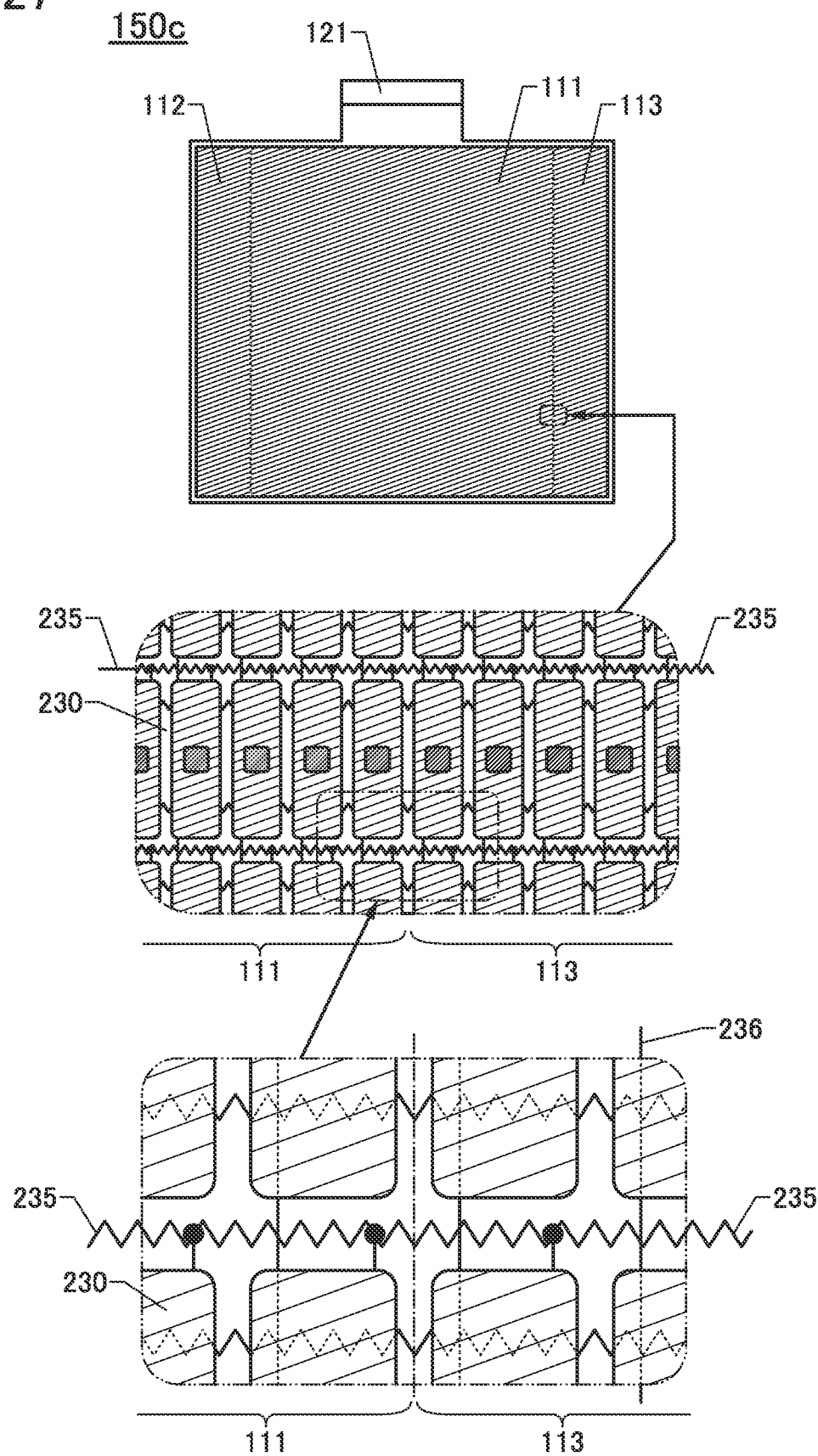
FIG. 27 illustrates one embodiment of the present invention.

Next, a display device 150c is described. FIG. 27 illustrates a plan view of the display device 150c which is a modification example of the display device 150b. Note that differences from the display device 150b are mainly described to avoid repeated description.

As in the display device 150c, the wiring 235 in the display region 111 may also have a meandering shape or a chain-like shape. When the wiring 235 in each of the display regions 111 to 113 has a meandering shape or a chain-like shape, a disconnection of the wiring 235 or the like does not occur easily even in the case where the display regions 111 to 113 are curved or bent. Therefore, defective operation, lowered reliability, or the like due to a short-circuit, a disconnection, or the like can be prevented.

Figure 28A:
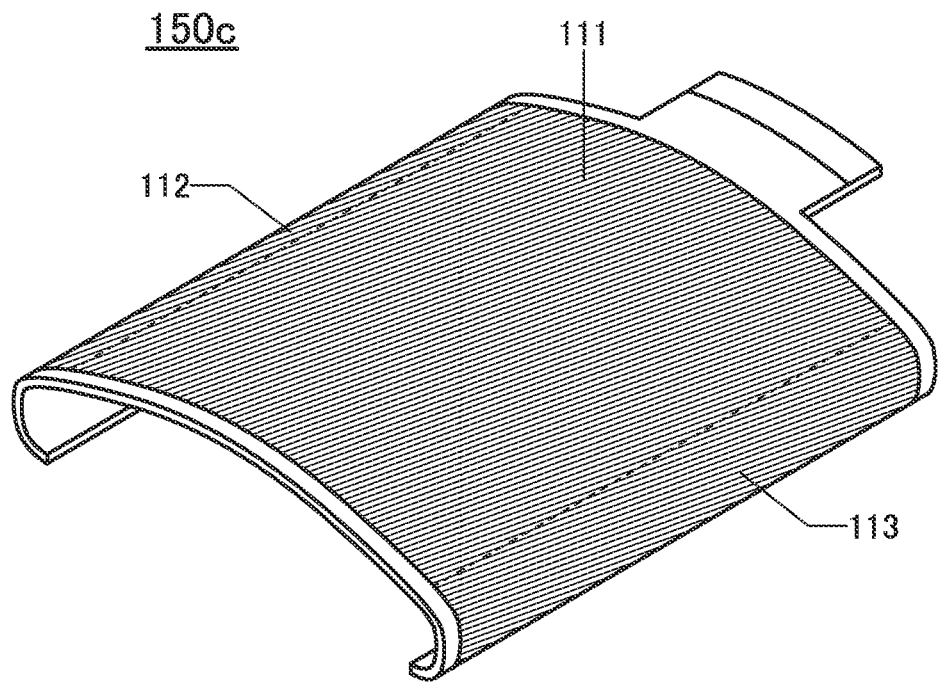
FIGS. 28A and 28B each illustrate one embodiment of the present invention.
Figure 28B:
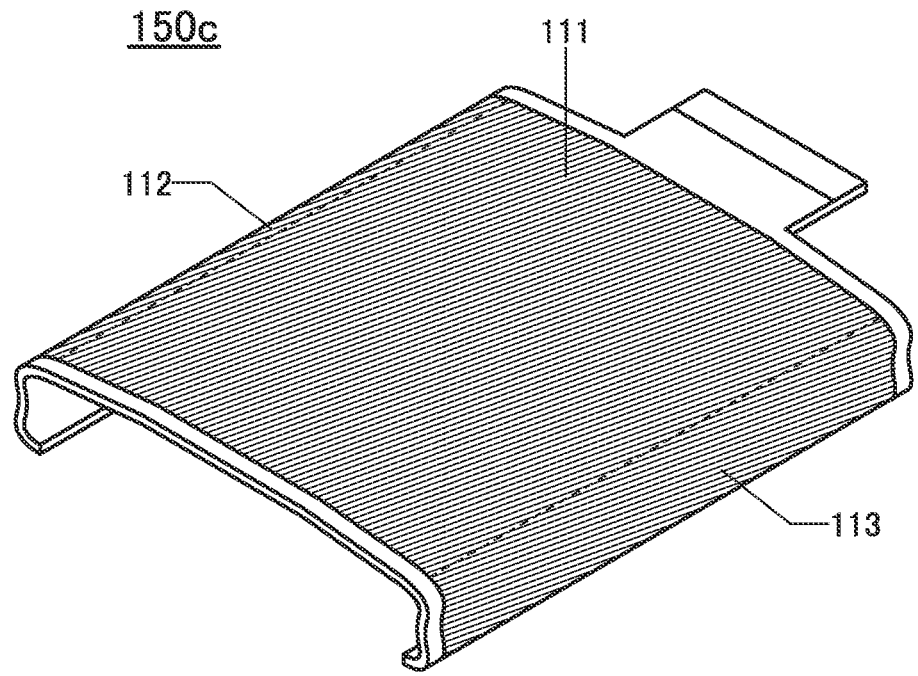

FIGS. 28A and 28B are perspective views of the display device 150c which is curved in the display regions 111 to 113.

This embodiment can be implemented in appropriate combinations with any of the other embodiments.

Embodiment 5

In this embodiment, structural examples of a light-emitting element 330 and a light-emitting element 331 which can be used as the light-emitting element 360 will be described. Note that an EL layer 320 described in this embodiment corresponds to the light-emitting layer 4511 described in another embodiment.

<Structure of Light-Emitting Element>

Figure 29A:
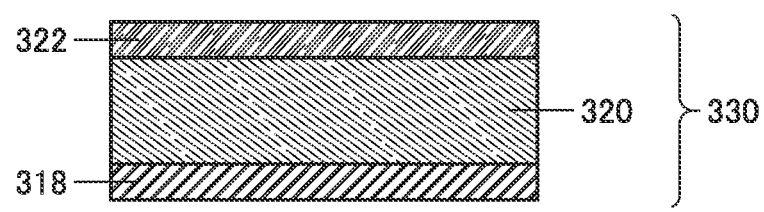
FIGS. 29A and 29B illustrate structure examples of light-emitting elements.

In the light-emitting element 330 illustrated in FIG. 29A, the EL layer 320 is provided between a pair of electrodes (an electrode 318 and an electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element 330 illustrated in FIG. 29A emits light when current flows because of a potential difference generated between the electrode 318 and the electrode 322 and holes and electrons are recombined in the EL layer 320. That is, the light-emitting region is formed in the EL layer 320.

In the present invention, light emitted from the light-emitting element 330 is extracted to the outside from the electrode 318 side or the electrode 322 side. Therefore, one of the electrodes 318 and 322 is formed of a light-transmitting substance.

Figure 29B:
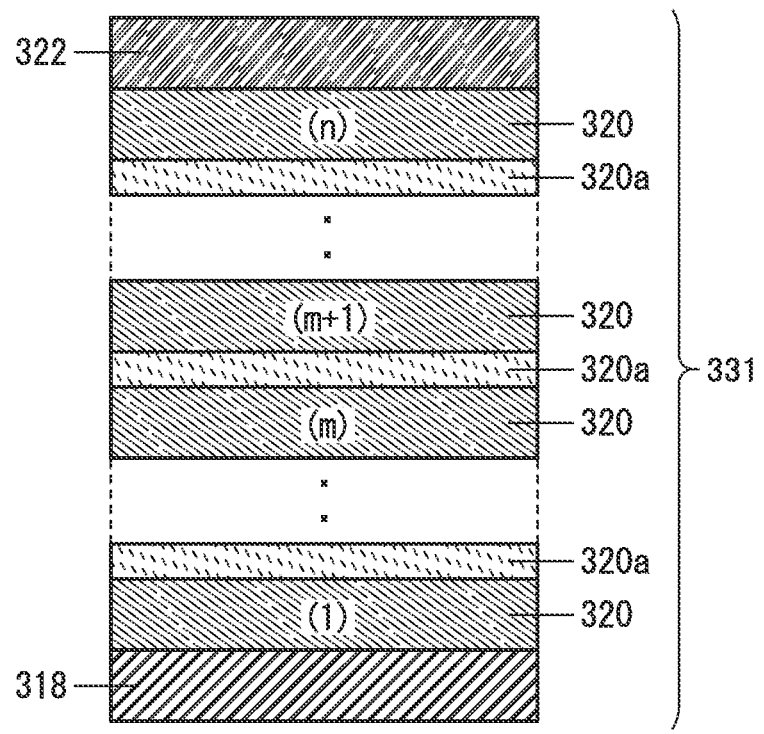

Note that a plurality of EL layers 320 may be stacked between the electrode 318 and the electrode 322 as in the light-emitting element 331 illustrated in FIG. 29B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. As the organic compound, it is preferable to use the organic compound which has a hole-transport property and has a hole mobility of $10^{-6}$ cm$^2$/Vs or higher. However, substances other than the substances given above may also be used as long as the substances have higher hole-transport properties than electron-transport properties. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of an organic compound and a metal oxide with another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

The light-emitting element 331 having such a structure is unlikely to have problems such as energy transfer and quenching and has an expanded choice of materials, and thus can easily have both a high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied between the electrode 318 and the electrode 322.

The light-emitting element 331 illustrated in FIG. 29B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light emission can be obtained.

In the case of obtaining white light emission using the light-emitting element 331 illustrated in FIG. 29B, as for the combination of a plurality of EL layers, a structure for emitting white light including red light, green light, and blue light may be used; for example, the structure may include a light-emitting layer containing a blue fluorescent substance as a light-emitting substance and a light-emitting layer containing red and green phosphorescent substances as light-emitting substances. Alternatively, a structure including a light-emitting layer emitting red light, a light-emitting layer emitting green light, and a light-emitting layer emitting blue light may be employed. Further alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like.

Note that in the structure of the above-described stacked-layer element, by providing the charge generation layer between the stacked light-emitting layers, the element can have a long lifetime in a high-luminance region while keeping the current density low. In addition, the voltage drop due to the resistance of the electrode material can be reduced, whereby uniform light emission in a large area is possible.

When the light-emitting element 330 and/or the light-emitting element 331 have/has a micro optical resonator (also referred to as microcavity) structure which allows light emitted from the EL layer 320 to resonate, lights with different wavelength ranges and narrowed spectra can be extracted even when one EL layer 320 is used for different light-emitting elements 331.

This embodiment can be implemented in appropriate combinations with any of the other embodiments.

Embodiment 6

In this embodiment, an oxide semiconductor, which is one type of metal oxide, will be described. An oxide semiconductor preferably contains indium or zinc. In particular, indium and zinc are preferably contained. In addition, an element M (M is one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) may be contained.

An oxide semiconductor, which is one type of metal oxide, is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in many cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, a lattice arrangement is distorted so that formation of a crystal grain boundary is inhibited. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor, which is one type of metal oxide, can have various structures which show various different properties. Two or more of the amorphous oxide semiconductor, the polycrystalline oxide semiconductor, the a-like OS, the nc-OS, and the CAAC-OS may be included in an oxide semiconductor that can be used in one embodiment of the present invention. Furthermore, a CAC-OS may be included.

This embodiment can be implemented in appropriate combinations with any of the other embodiments.

Embodiment 7

In this embodiment, examples of an electronic device that uses the display device of one embodiment of the present invention will be described.

Specific examples of the electronic device that uses the display device of one embodiment of the present invention are as follows: display devices of televisions, monitors, and the like, lighting devices, desktop and laptop personal computers, word processors, image reproduction devices that reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Further examples include the following industrial equipment: guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units, and the like may also be included in the range of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecraft, and the like.

The electronic devices described in this embodiment can include the above-described display device and the like.

Figure 30A:
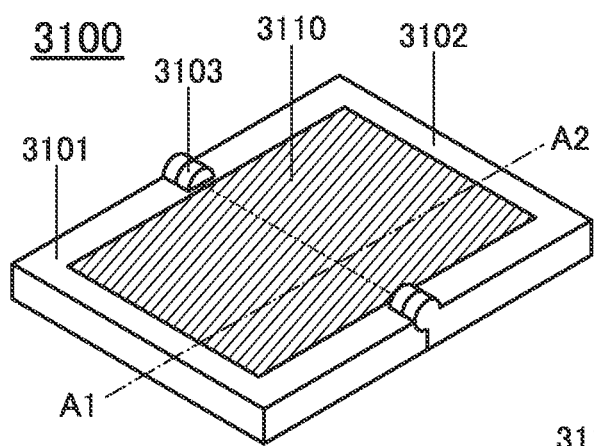
FIGS. 30A to 30E illustrate an example of an electronic device.
Figure 30B:
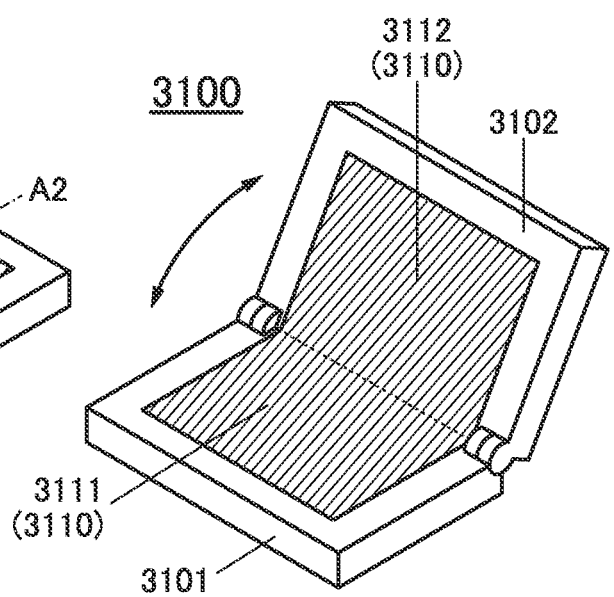
Figure 30C:
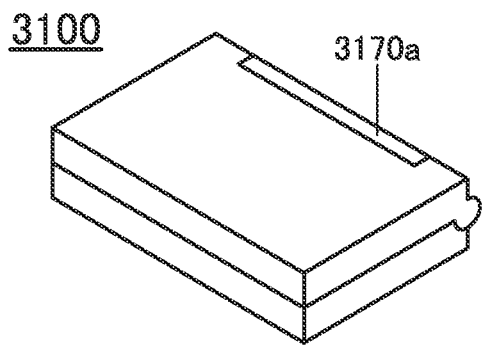
Figure 30D:
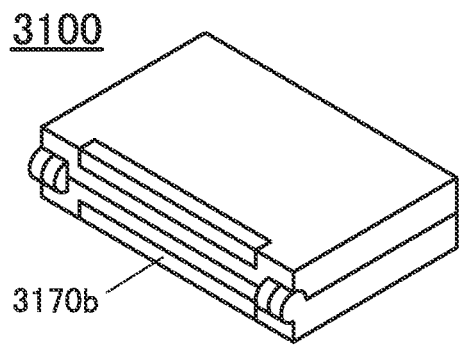
Figure 30E:
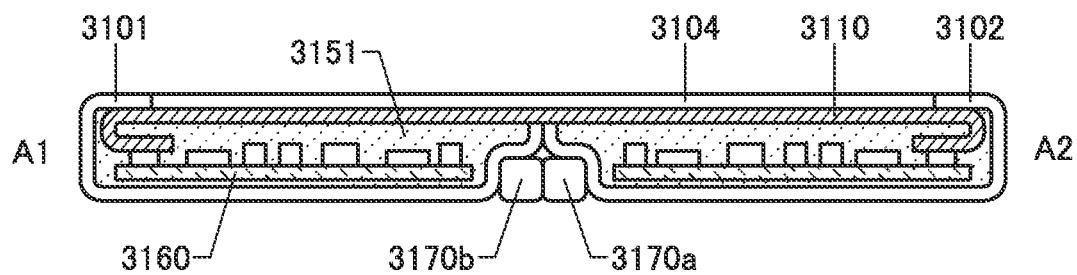

As an example of an electronic device, FIGS. 30A to 30D show perspective views of an electronic device 3100. FIG. 30E is a cross-sectional view taken along dashed-dotted line A1-A2 in FIG. 30A. FIGS. 30C and 30D illustrate a state in which the electronic device 3100 is folded in two. FIG. 30A illustrates a state in which the electronic device 3100 is opened. FIG. 30B illustrates a state in which the electronic device 3100 is in the process of being opened or closed.

The electronic device 3100 includes a housing 3101, a housing 3102, a hinge portion 3103, a cover member 3104, a display device 3110, a circuit board 3160, a battery 3170a, a battery 3170b, and the like. A central processing unit, a memory device, a display portion control device, or the like is provided on the circuit board 3160. Note that another semiconductor device or the like may be provided in a region 3151 inside the housing 3101. In addition, a functional member such as a member for dissipating heat, a member for absorbing or blocking electromagnetic waves, and/or a member for blocking magnetism may be provided in the region 3151.

The housing 3101 and the housing 3102 are connected by the hinge portion 3103. In addition, the housing 3101 and the housing 3102 can be relatively rotated on the axis of the hinge portion 3103.

The display device 3110 includes a display region 3111 overlapping with the housing 3101 and a display region 3112 overlapping with the housing 3102. In addition, the display device 3110 includes a bend region (not illustrated) between the display region 3111 and the display region 3112. The cover member 3104 includes a region overlapping with the display region 3111 and a region overlapping with the display region 3112. The cover member 3104 has a function of transmitting visible light.

The electronic device 3100 may be provided with a touch sensor or the like as an input device. The electronic device 3100 may also be provided with a camera, a microphone, a speaker, a communication device, and the like. The display device described in any of the above embodiments can be used as the display device 3110.

This embodiment can be implemented in appropriate combinations with any of the other embodiments.

This application is based on Japanese Patent Application serial no. 2016-125667 filed with Japan Patent Office on Jun. 24, 2016, Japanese Patent Application serial no. 2016-131297 filed with Japan Patent Office on Jul. 1, 2016, and Japanese Patent Application serial no. 2016-154452 filed with Japan Patent Office on Aug. 5, 2016, the entire contents of which are hereby incorporated by reference.

What is claimed is:

1. A display device comprising:
a first display region; and
a second display region,
wherein the first display region and the second display region are adjacent to each other,
wherein the first display region comprises a curved surface forming a bent portion,
wherein the first display region comprises a first wiring,
wherein the first wiring meanders on the bent portion in the first display region,
wherein the second display region comprises a second wiring, and
wherein the first wiring is directly connected to the second wiring.

2. The display device according to claim 1, further comprising a first substrate and a second substrate,
wherein the first display region and the second display region are provided between the first substrate and the second substrate.

3. The display device according to claim 2, wherein the first substrate and the second substrate have flexibility.

4. The display device according to claim 1,
wherein each of the first display region and the second display region comprises a first display element and a second display element,
wherein the first display element is configured to reflect visible light, and
wherein the second display element is configured to emit visible light.

5. The display device according to claim 4, wherein the first display element is a liquid crystal element.

6. The display device according to claim 4, wherein the second display element is an organic EL element.

7. The display device according to claim 1, wherein the meandering first wiring has a repeating pattern selected from one or more of a triangular wave, a sine wave, an arc, a meandering combination of straight lines, a meandering combination of straight lines and curves, and a chain-like shape.

8. The display device according to claim 1, wherein the first wiring is a scan line.

9. A display device comprising:
a first display region; and
a second display region,
wherein the first display region and the second display region are adjacent to each other,
wherein the first display region comprises a curved surface forming a bent portion,
wherein the first display region comprises a first wiring,
wherein the second display region comprises a curved surface,
wherein the second display region comprises a second wiring,
wherein the first wiring is directly connected to the second wiring,
wherein the first wiring meanders in the first display region, and
wherein the second wiring meanders in the second display region.

10. The display device according to claim 9, further comprising a first substrate and a second substrate,
wherein the first display region and the second display region are provided between the first substrate and the second substrate.

11. The display device according to claim 10, wherein the first substrate and the second substrate have flexibility.

12. The display device according to claim 9,
wherein each of the first display region and the second display region comprises a first display element and a second display element,
wherein the first display element is configured to reflect visible light, and
wherein the second display element is configured to emit visible light.

13. The display device according to claim 12, wherein the first display element is a liquid crystal element.

14. The display device according to claim 12, wherein the second display element is an organic EL element.

15. The display device according to claim 9, wherein the meandering first wiring has a repeating pattern selected from one or more of a triangular wave, a sine wave, an arc, a meandering combination of straight lines, a meandering combination of straight lines and curves, and a chain-like shape.

16. The display device according to claim 9, wherein the meandering second wiring has a repeating pattern selected from one or more of a triangular wave, a sine wave, an arc, a meandering combination of straight lines, a meandering combination of straight lines and curves, and a chain-like shape.

17. The display device according to claim 9, wherein the each of the first wiring and the second wiring is a scan line.

* * * * *